United States Patent
Kim et al.

(10) Patent No.: US 11,076,234 B2
(45) Date of Patent: Jul. 27, 2021

(54) DISPLAY DEVICE AND DRIVING METHOD THEREOF

(71) Applicant: SAMSUNG DISPLAY CO., LTD., Yongin-si (KR)

(72) Inventors: Ga Na Kim, Icheon-si (KR); Yi Joon Ahn, Seoul (KR); Jung Hun Noh, Yongin-si (KR); Eun Kyung Yeon, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/710,400

(22) Filed: Dec. 11, 2019

(65) Prior Publication Data

US 2020/0314547 A1    Oct. 1, 2020

(30) Foreign Application Priority Data

Apr. 1, 2019  (KR) .......... 10-2019-0037672

(51) Int. Cl.
| | |
|---|---|
| *H04R 9/02* | (2006.01) |
| *B06B 1/04* | (2006.01) |
| *H01L 27/32* | (2006.01) |
| *H04R 1/02* | (2006.01) |
| *H04R 3/00* | (2006.01) |
| *H04R 9/06* | (2006.01) |

(52) U.S. Cl.
CPC ............ *H04R 9/025* (2013.01); *B06B 1/045* (2013.01); *H01L 27/322* (2013.01); *H01L 27/3225* (2013.01); *H01L 27/3244* (2013.01); *H04R 1/028* (2013.01); *H04R 3/00* (2013.01); *H04R 9/06* (2013.01); *H04R 2400/03* (2013.01); *H04R 2400/11* (2013.01); *H04R 2499/11* (2013.01); *H04R 2499/15* (2013.01)

(58) Field of Classification Search
CPC ......... G06F 3/016; G06F 3/0488; G08B 6/00; H01H 2003/008; H04R 2499/15
See application file for complete search history.

(56) References Cited

U.S. PATENT DOCUMENTS

| | | | |
|---|---|---|---|
| 7,764,803 B2 * | 7/2010 | Kang | .................. H04R 7/04 381/152 |
| 10,216,231 B1 * | 2/2019 | Landick | ................. B06B 1/045 |
| 2004/0227721 A1 * | 11/2004 | Moilanen | ............. G06F 1/1684 345/107 |
| 2019/0094976 A1 * | 3/2019 | Szeto | .................... H01H 3/503 |

FOREIGN PATENT DOCUMENTS

| | | |
|---|---|---|
| KR | 10-2014-0119474 | 10/2014 |
| KR | 10-2017-0000596 | 1/2017 |

* cited by examiner

*Primary Examiner* — Kile O Blair
(74) *Attorney, Agent, or Firm* — F. Chau & Associates, LLC

(57) ABSTRACT

A display device includes a display panel; a panel bottom member disposed on the display panel; a middle frame disposed on the panel bottom member; an electronic permanent magnet attached to the panel bottom member and that switches between an activation state to generate a magnetic force and an inactivation state; and a vibrator attached to the middle frame and that vibrates, wherein the electronic permanent magnet and the vibrator overlap each other in a thickness direction of the display device.

20 Claims, 17 Drawing Sheets

FIG. 12
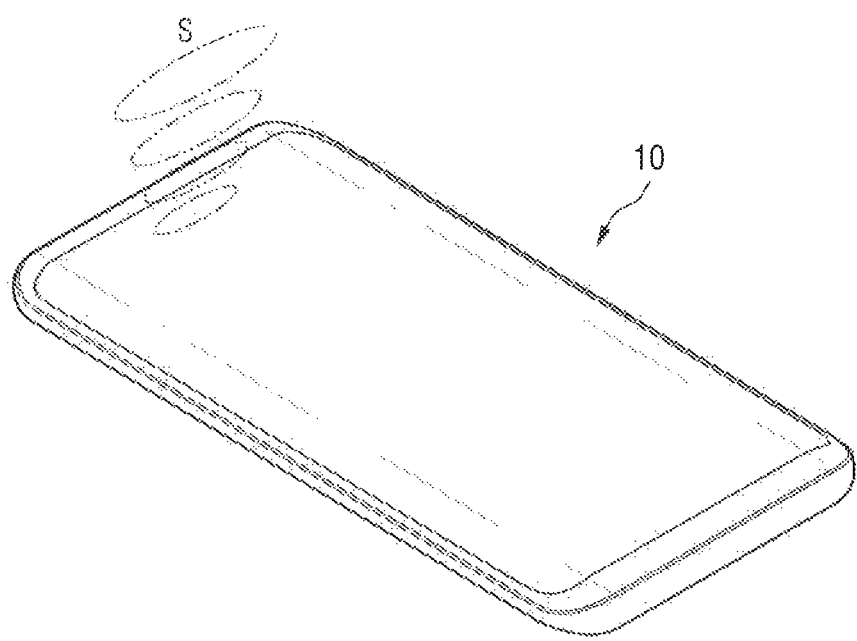
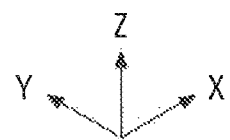

DISPLAY DEVICE AND DRIVING METHOD THEREOF

CROSS-REFERENCE TO RELATED APPLICATION

This application claims priority under 35 U.S.C § 119 to Korean Patent Application No. 10-2019-0037672, filed on Apr. 1, 2019, in the Korean Intellectual Property Office (KIPO), the disclosure of which is incorporated by reference herein in its entirety.

TECHNICAL FIELD

The present invention relates to a display device and a driving method thereof.

DISCUSSION OF THE RELATED ART

As information is more widely dispersed, the demand for display devices for displaying images has increased and diversified. For example, display devices have been applied to a variety of electronic devices such as a smartphone, a tablet personal computer (PC), a digital camera, a notebook computer, a navigation device, a smart television (TV), or the like. A typical display device may include a display panel for displaying images and a sound generating device for providing sound.

In addition, as display devices have been applied to various electronic devices, the demand for display devices with various designs has increased. For example, a smartphone including a display device having a sound generating device, which outputs the voice of the other party during a call, that is not on the front of the display device is currently under development.

SUMMARY

According to an exemplary embodiment of the present invention, a display device includes a display panel; a panel bottom member disposed on the display panel; a middle frame disposed on the panel bottom member; an electronic permanent magnet attached to the panel bottom member and that switches between an activation state to generate a magnetic force and an inactivation state; and a vibrator attached to the middle frame and that vibrates, wherein the electronic permanent magnet and the vibrator overlap each other in a thickness direction of the display device.

In an exemplary embodiment of the present invention, when the electronic permanent magnet is in the activation state, the vibrator is configured to contact the electronic permanent magnet due to the magnetic force generated by the electronic permanent magnet.

In an exemplary embodiment of the present invention, when the electronic permanent magnet is in the inactivation state, the vibrator and the electronic permanent magnet are separated from each other in the thickness direction.

In an exemplary embodiment of the present invention, the display device further includes: a sound driver electrically connected to the vibrator, wherein when the electronic permanent magnet is in the activation state, the sound driver generates sound by driving the vibrator to vibrate the display panel and the panel bottom member.

In an exemplary embodiment of the present invention, when the electronic permanent magnet is in the inactivation state, the sound driver provides a haptic feedback by driving the vibrator to vibrate the middle frame.

In an exemplary embodiment of the present invention, when the electronic permanent magnet is in the inactivation state of the electronic permanent magnet, a distance between the vibrator and the electronic permanent magnet is greater than a vibration displacement of the vibrator.

In an exemplary embodiment of the present invention, the electronic permanent magnet includes first and second magnets which are separated from each other, the first magnet includes a magnetically semi-hard material, and the second magnet includes a magnetically hard material.

In an exemplary embodiment of the present invention, the electronic permanent magnet further includes a top cover and a bottom cover, wherein the top cover is in contact with upper surfaces of the first and second magnets, wherein the bottom cover is in contact with lower surfaces of the first and second magnets, and the top cover is attached to the panel bottom member.

In an exemplary embodiment of the present invention, the electronic permanent magnet further includes a coil which is wound around the first magnet, and the first magnet has a first polarity when a current flows in the coil in a first direction and has a second polarity, which is opposite to the first polarity, when a current flows in the coil in a second direction, which is opposite to the first direction.

In an exemplary embodiment of the present invention, the vibrator is a linear resonant actuator.

In an exemplary embodiment of the present invention, the vibrator is an exciter.

In an exemplary embodiment of the present invention, the display device further includes: a first circuit board connected to the electronic permanent magnet; and a second circuit board connected to the vibrator.

In an exemplary embodiment of the present invention, the display device further includes a display circuit board attached to the display panel, wherein the first and second circuit boards are connected to the display circuit board.

In an exemplary embodiment of the present invention, the display circuit board includes a magnet driver that provides the electronic permanent magnet with a first current flowing in a first direction and a second current flowing in a second direction that is opposite to the first direction.

In an exemplary embodiment of the present invention, the display circuit board further includes a sound driver that outputs first and second driving voltages to the vibrator.

In an exemplary embodiment of the present invention, the display device further includes a main circuit board disposed on the middle frame and including a main processor, wherein the main processor outputs sound data or haptic data to the sound driver.

According to an exemplary embodiment of the present invention, a driving method of a display device including: outputting sound by vibrating an electronic permanent magnet and a vibrator when in an activation state where an electronic permanent magnet generates a magnetic force; and providing a haptic feedback by vibrating the vibrator when in an inactivation state where the electronic permanent magnet does not generate the magnetic force.

In an exemplary embodiment of the present invention, the outputting the sound includes activating the electronic permanent magnet by applying a current flowing in a first direction to the electronic permanent magnet such that the electronic permanent magnet and the vibrator contact each other.

In an exemplary embodiment of the present invention, the outputting the sound further includes vibrating a display panel of the display device with vibrations generated from the vibrator while the electronic permanent magnet and the vibrator are in contact with each other.

In an exemplary embodiment of the present invention, the providing the haptic feedback includes inactivating the electronic permanent magnet by applying a current flowing in a second direction, which is opposite to the first direction, to the electronic permanent magnet such that the electronic permanent magnet and the vibrator are separated from each other.

BRIEF DESCRIPTION OF THE DRAWINGS

The above and other features of the present invention will become more apparent by describing in detail exemplary embodiments thereof with reference to the accompanying drawings, in which:

FIG. 12 is a perspective view illustrating how the display device of FIG. 1 outputs sound;

DETAILED DESCRIPTION OF THE EMBODIMENTS

Figure 1:
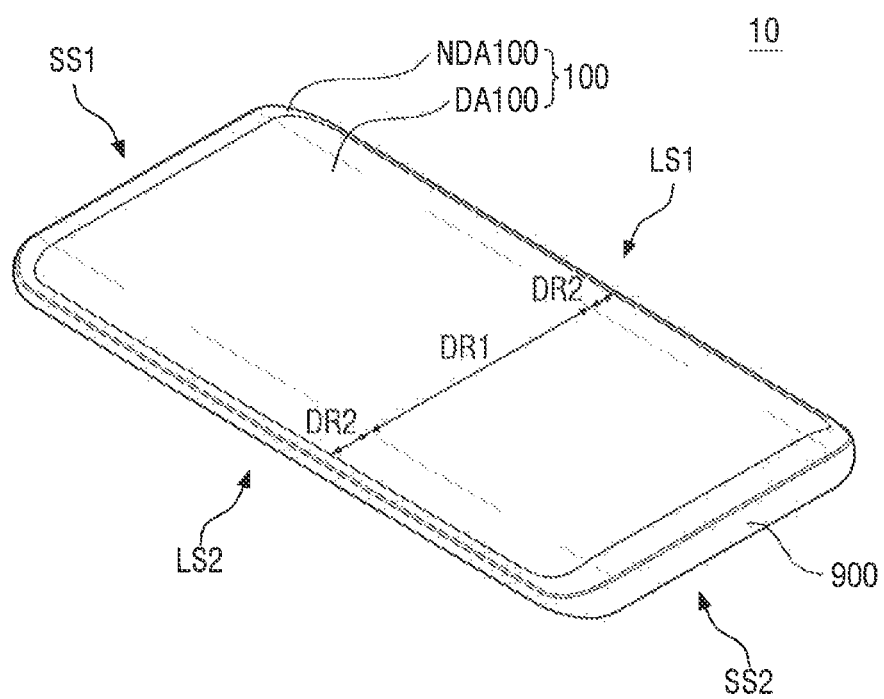
FIG. 1 is a perspective view of a display device according to an exemplary embodiment of the present invention.

Exemplary embodiments of the present invention will now be described more fully hereinafter with reference to the accompanying drawings. The present invention may, however, be embodied in different forms and should not be construed as limited to the exemplary embodiments set forth herein. The same reference numbers may indicate the same components throughout the specification, and thus repetitive descriptions may be omitted. In the attached figures, the size and the thickness of layers and regions may be exaggerated for clarity. In other words, since sizes and thicknesses of layers and regions in the drawings may be exaggerated for clarity, the following exemplary embodiments of the present invention are not limited thereto.

It will also be understood that when a layer or element is referred to as being "on" another layer or element, the element or layer can be directly on the other layer or element, or intervening layers or elements may be present.

Hereinafter, exemplary embodiments of the present invention will be described with reference to the attached drawings.

Figure 2:
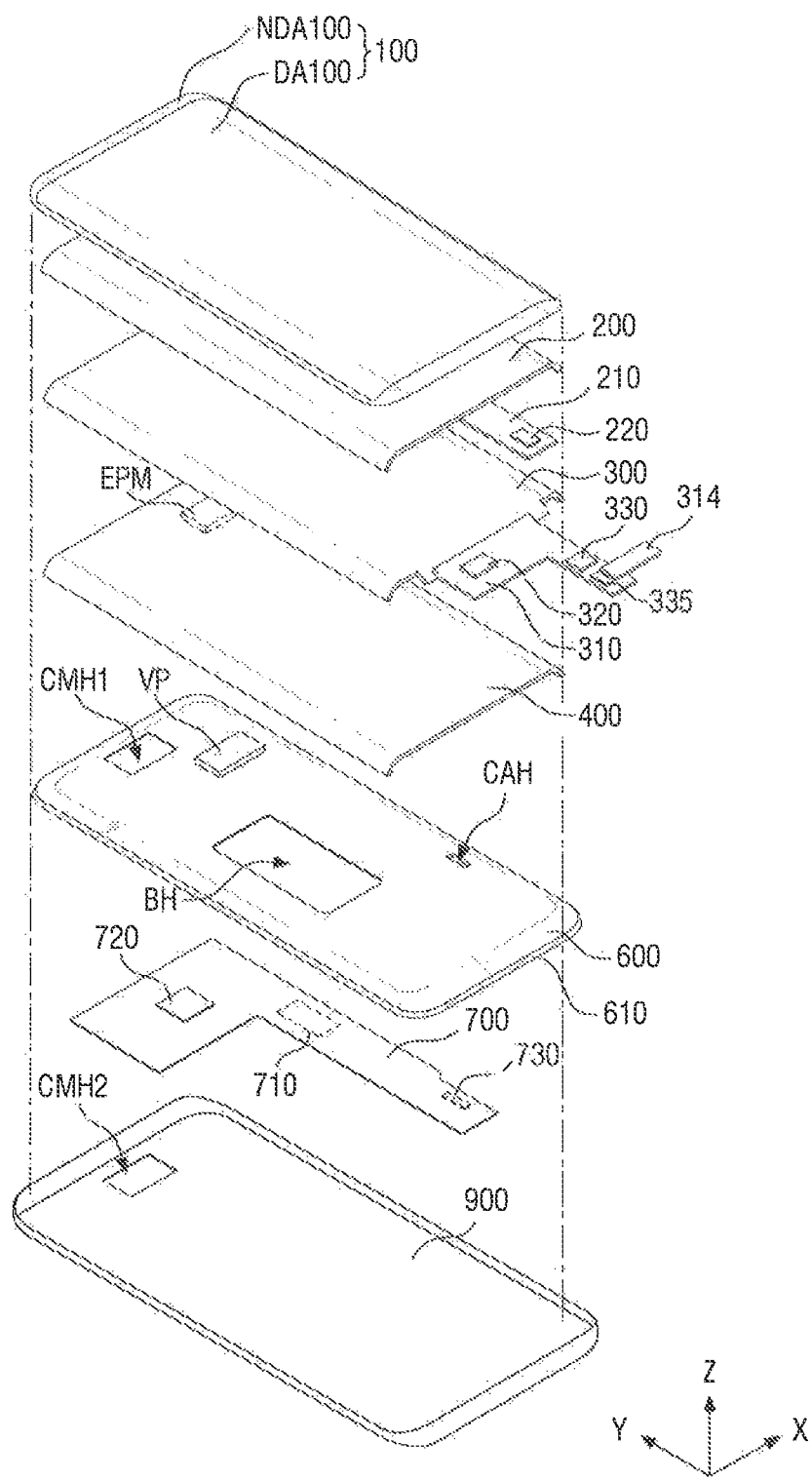
FIG. 2 is an exploded perspective view of the display device of FIG. 1.

FIG. 1 is a perspective view of a display device according to an exemplary embodiment of the present invention. FIG. 2 is an exploded perspective view of the display device of FIG. 1.

Referring to FIGS. 1 and 2, a display device 10 includes a cover window 100, a touch sensing device 200, a touch circuit board 210, a touch drive 220, a display panel 300, a display circuit board 310, a display drive 320, a panel bottom member 400, an electronic permanent magnet EPM, a vibrator VP, a middle frame 600, a main circuit board 700, and a lower cover 900.

The terms "above", "top", and "top surface", as used herein, denote a direction in which the cover window 100 is disposed on the display panel 300, i.e., a Z-axis direction, and the terms "below", "bottom", and "bottom surface", as used herein, denote a direction in which the middle frame 600 is disposed on the display panel 300, i.e., the direction opposite to the Z-axis direction (e.g., a negative Z-axis direction). In addition, the terms "left", "right", "upper", and "lower", as used herein, denote their respective directions as viewed from above the display panel 300. For example, the term "left" denotes the opposite direction of an X-axis direction (e.g., a negative X-axis direction), the term "right" denotes the X-axis direction, the term "upper" denotes the Z-axis direction, and the term "lower" denotes the opposite direction of the Z-axis direction.

The display device 10 may have a rectangular shape in a plan view. For example, in a plan view, the display device 10 may have a rectangular shape having first and second short sides SS1 and SS2 extending in a first direction (or the X-axis direction) and facing each other in a second direction (or a Y-axis direction) and first and second long sides LS1 and LS2 extending in the second direction (or the Y-axis direction) and facing each other in the first direction (or the X-axis direction). The corners at which the first and second short sides SS1 and SS2 and the long sides LS1 and LS2 meet may be rounded to have a predetermined curvature or may be right-angled. For example, the display device 10 may have a rectangular shape with rounded corners or right-angled corners. The planar shape of the display device 10 is not particularly limited thereto, and for example, the display device 10 may be formed in another polygonal shape, a circular shape, or an elliptical shape in a plan view.

The display device 10 may include a first region DR1 which is formed to be substantially flat and second regions DR2 which respectively extend from the left and right sides of the first region DR1. The second regions DR2 may be formed to be flat or curved. In a case where the second regions DR2 are formed to be flat, the angle that the first region DR1 forms with each of the second regions DR2 form may be an obtuse angle. In a case where the second regions DR2 are formed to be curved, the second regions DR2 may have a uniform curvature or a varying curvature.

FIG. 1 illustrates that the second regions DR2 respectively extend from the left and right sides of the first region DR1, but the present invention is not limited thereto. For example, the second regions DR2 may extend from only one of the left and right sides of the first region DR1. Further, the second regions DR2 may extend not only from the left and right sides of the first region DR1, but also from at least one of the upper and lower sides of the first region DR1. In the description that follows, it is assumed that the second regions DR2 are disposed on the left and right sides of the display device 10.

Figure 6:
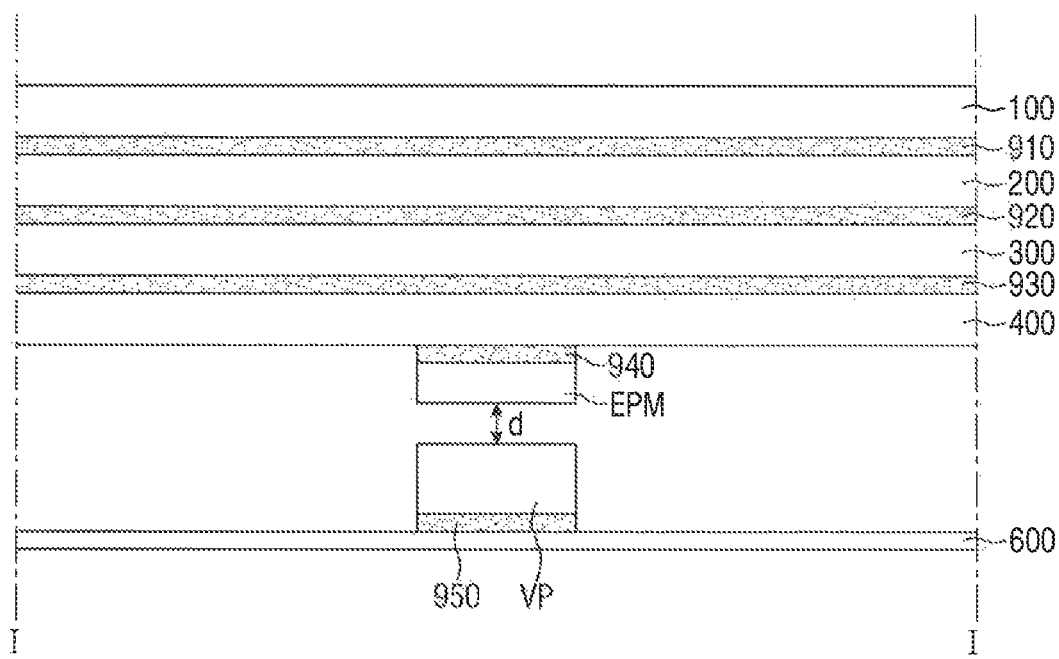
FIG. 6 is a cross-sectional view taken along line I-I' of the display device of FIGS. 3 and 4.

The cover window 100 may be disposed on the display panel 300 to cover the top surface of the display panel 300. Accordingly, the cover window 100 may protect the top surface of the display panel 300. As illustrated in FIG. 6, the cover window 100 may be attached to the touch sensing device 200 via a first adhesive member 910. For example, the first adhesive member 910 may be an optically clear adhesive (OCA) or an optically clear resin (OCR).

The cover window 100 may include a light-transmitting part DA100 which corresponds to the display panel 300 and a light-blocking part NDA100 which corresponds to the rest of the display device 10. For example, the light-blocking part NDA100 may at least partially surround the light-transmitting part DA100. The cover window 100 may be disposed in the first region DDR and in the second regions DR2. The light-transmitting part DA100 may be disposed in part in the first region DR1 and in part in the second regions DR2. The light-transmitting part NDA100 may be formed to be opaque. For example, in a case where the light-blocking part NDA100 does not display an image, the light-blocking part NDA100 may be formed as a decorative layer that can be seen by a user. For example, a company's logo such as "SAMSUNG" or a string of various characters or letters may be patterned into the light-blocking part NDA100. In addition, holes, which are for exposing a front camera, a front speaker, an infrared (IR) sensor, an iris recognition sensor, an illumination sensor, a proximity sensor or the like, may be formed in the light-blocking part NDA100, but the present invention is not limited thereto. For example, some or all of the front camera, the front speaker, the IR sensor, the iris recognition sensor, and the illumination sensor may be embedded in the display panel 300, in which case, some or all of the holes may not be provided.

The cover window 100 may be formed of glass, sapphire, and/or plastic. The cover window 100 may be formed to be rigid or flexible.

The touch sensing device 200 may be disposed between the cover window 100 and the display panel 300. The touch sensing device 200 may be disposed in the first area DR1 and the second areas DR2. Accordingly, touch input from the user can be detected not only in the first area DR1, but also in the second areas DR2.

As illustrated in FIG. 6, the touch sensing device 200 may be attached to the bottom surface of the cover window 100 via the first adhesive member 910. A polarizing film may be added to the top of the touch sensing device 200 to prevent the degradation of visibility that may be caused by the reflection of external light. In this case, the polarizing film may be attached to the bottom surface of the cover window 100 via the first adhesive member 910.

The touch sensing device 200, which is a device for detecting the location of touch input from the user, may be implemented as a capacitive type such as a self-capacitance type or a mutual capacitance type. In a case where the touch sensing device 200 is implemented as being of the self-capacitance type, the touch sensing device 200 may include only touch driving electrodes. In a case where the touch sensing device 200 is implemented as being of the mutual capacitance type, the touch sensing device 200 may include touch driving electrodes and touch sensing electrodes. In the description that follows, it is assumed that the touch sensing device 200 is of the mutual capacitance type.

The touch sensing device 200 may be formed as a panel or a film. In this case, the touch sensing device 200 may be attached to a thin-film encapsulation film of the display panel 300 via a second adhesive member 920, as illustrated in FIG. 6. For example, the second adhesive member 920 may be an OCA or an OCR.

In addition, the touch sensing device 200 may be formed as one integral body with the display panel 300. In this case, the touch driving electrodes and the touch sensing electrodes of the touch sensing device 200 may be formed on the thin-film encapsulation film of the display panel 300 or on an encapsulation substrate or film covering a light-emitting element layer of the display panel 300.

Figure 3:
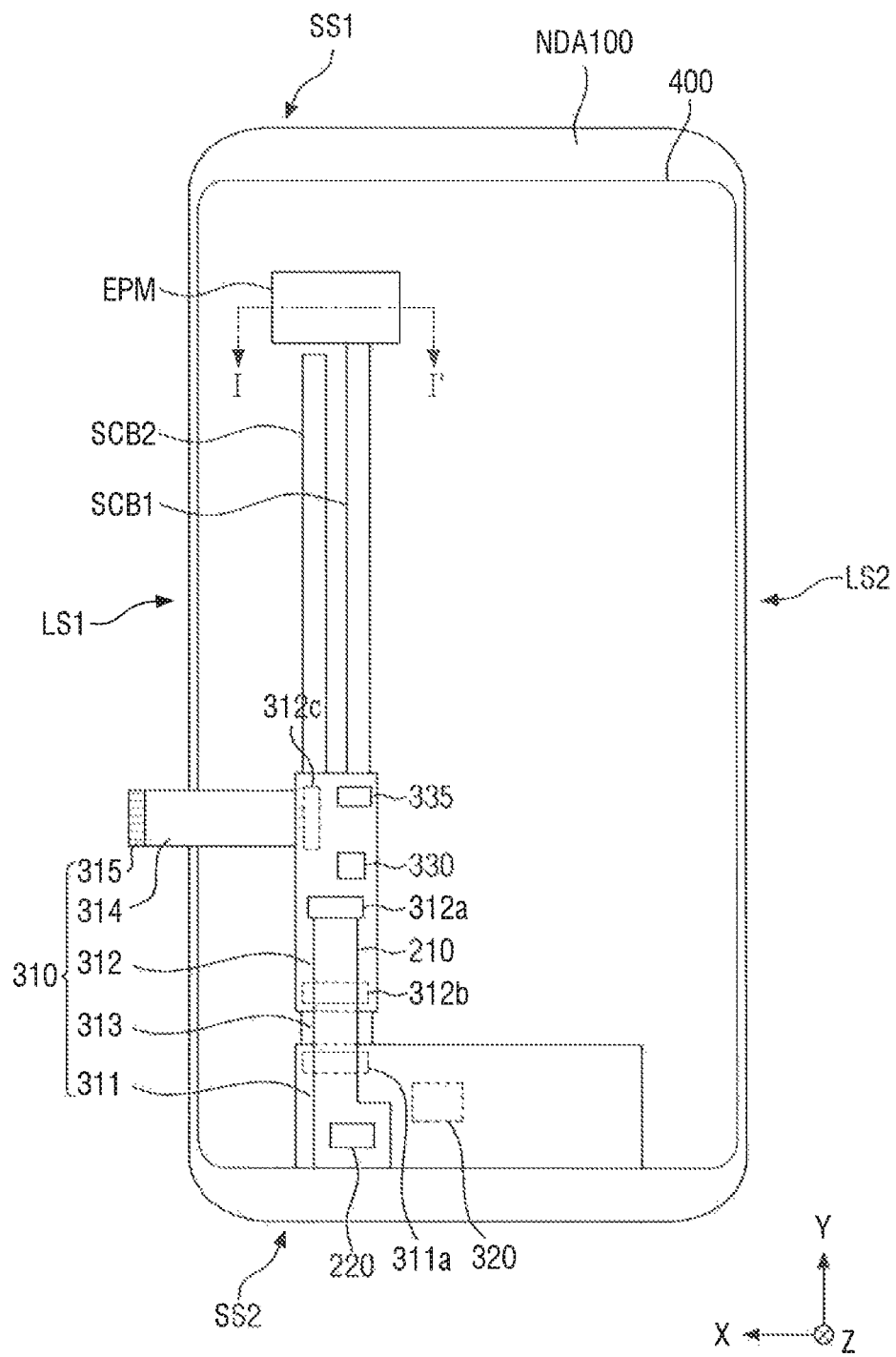
FIG. 3 is a bottom view illustrating a cover window, a touch circuit board, a display panel, a display circuit board, a panel bottom member, an electronic permanent magnet, a first circuit board, and a second circuit board of the display device of FIG. 2.

The touch circuit board 210 may be attached to one side of the touch sensing device 200. For example, one end of the touch circuit board 210 may be attached to pads provided on one side of the touch sensing device 200 via an anisotropic conductive film. As illustrated in FIG. 3, a touch connecting part may be provided at the other end of the touch circuit board 210 and may be connected to a touch connector 312a of the display circuit board 310. For example, the touch circuit board 210 may be a flexible printed circuit board.

The touch driver 220 may apply touch driving signals to the touch driving electrodes of the touch sensing device 200, may detect sensing signals from the touch sensing electrodes of the touch sensing device 200, and may calculate the location of touch input from the user by analyzing the detected sensing signals. The touch driver 220 may be formed as an integrated circuit and may be mounted on the touch circuit board 210.

The display panel 300 may be disposed below the touch sensing device 200. The display panel 300 may be disposed to overlap the light-transmitting part DA100 of the cover window 100. The display panel 300 may be disposed in the first area DR1 and the second areas DR2. As a result, an image from the display panel 300 can be seen not only in the first area DR1, but also in the second areas DR2.

The display panel 300 may be a light-emitting display panel including light-emitting to elements. For example, the display panel 300 may be an organic light-emitting diode (OLED) display panel using OLEDs, a micro-light-emitting diode (mLED) display panel using mLEDs, or a quantum-dot light-emitting diode (QLED) display panel using QLEDs. In the description that follows, the display panel 300 is, as an example, an OLED display panel. The display panel 300 will be described later in detail with reference to FIG. 17.

The display circuit board 310 may be attached to one side of the display panel 300. For example, one end of the display circuit board 310 may be attached to pads provided on one side of the display panel 300 via an anisotropic conductive film. The display circuit board 310 may be bent toward the bottom surface of the display panel 300. For example, the display circuit board 310 may be bent to face the bottom surface of the display panel 300. The touch circuit board 210 may also be bent toward the bottom surface of the display panel 300. For example, the touch circuit board 210 may be bent to face the bottom surface of the display panel 300. As a result, the touch connecting part provided at the touch circuit board 210 may be connected to the touch connector 312a of the display circuit board 310. The display circuit board 310 will be described later with reference to FIGS. 3 through 5.

The display driver 320 outputs, via the display circuit board 310, signals and voltages for driving the display panel 300. The display driver 320 may be formed as an integrated circuit and may be mounted on the display circuit board 310, but the present invention is not limited thereto. For example, the display driver 320 may be attached directly to the display panel 300, in which case, the display driver 320 may be attached to the top surface or the bottom surface of the display panel 300.

The panel bottom member 400 may be disposed below the display panel 300, as illustrated in FIG. 6. The panel bottom member 400 may be attached to the bottom surface of the display panel 300 via a third adhesive member 930. For example, the third adhesive member 930 may be an OCA or an OCR.

The panel bottom member 400 may include at least one of a light-absorbing member for absorbing incident light from the outside, a buffer member for absorbing shock from the outside, a heat dissipation member for releasing heat from the display panel 300, and/or a light-shielding layer for blocking incident light from the outside.

The light-absorbing member may be disposed below the display panel 300. The light-absorbing member blocks the transmission of light and thus prevents the elements disposed therebelow, e.g., the electronic permanent magnet EMP, the vibrator VP, and the display circuit board 310, from becoming visible from above the display panel 300. The light-absorbing member may include a light-absorbing material such as a black pigment or dye.

The buffer member may be disposed below the light-absorbing member. The buffer member may absorb shock from the outside and thus prevent the display panel 300 from being damaged. The buffer member may be formed as a single layer or as multiple layers. For example, the buffer member may include a polymer resin such as polyurethane, polycarbonate, polypropylene, or polyethylene or an elastic material such as a sponge obtained by foam-molding rubber, a urethane-based material or an acrylic material. The buffer member may be a cushion layer.

The heat dissipation member may be disposed below the buffer member. The heat dissipation member may include a first heat dissipation layer including graphite or carbon nanotubes and a second heat dissipation layer formed as a thin metal film using a metal having excellent thermal conductivity such as copper (Cu), nickel (Ni), ferrite, or silver (Ag).

The electronic permanent magnet EPM may be disposed below the panel bottom member 400. For example, as illustrated in FIG. 6, the electronic permanent magnet EPM may be attached to the bottom surface of the panel bottom member 400 via a fourth adhesive member 940. For example, the fourth adhesive member 940 may be a pressure sensitive adhesive (PSA).

The electronic permanent magnet EPM may include a first magnet which can be selectively switched between a first polarity and a second polarity that is opposite to the first polarity and a second magnet which is adjacent to the first magnet and is fixed to the first polarity. The electronic permanent magnet EPM may be switched, in accordance with a variation in the polarity of the first magnet, between an activation mode in which an attractive magnetic force toward the electronic permanent magnet EPM is generated and an inactivation mode in which the attractive magnetic force is not generated.

Figure 4:
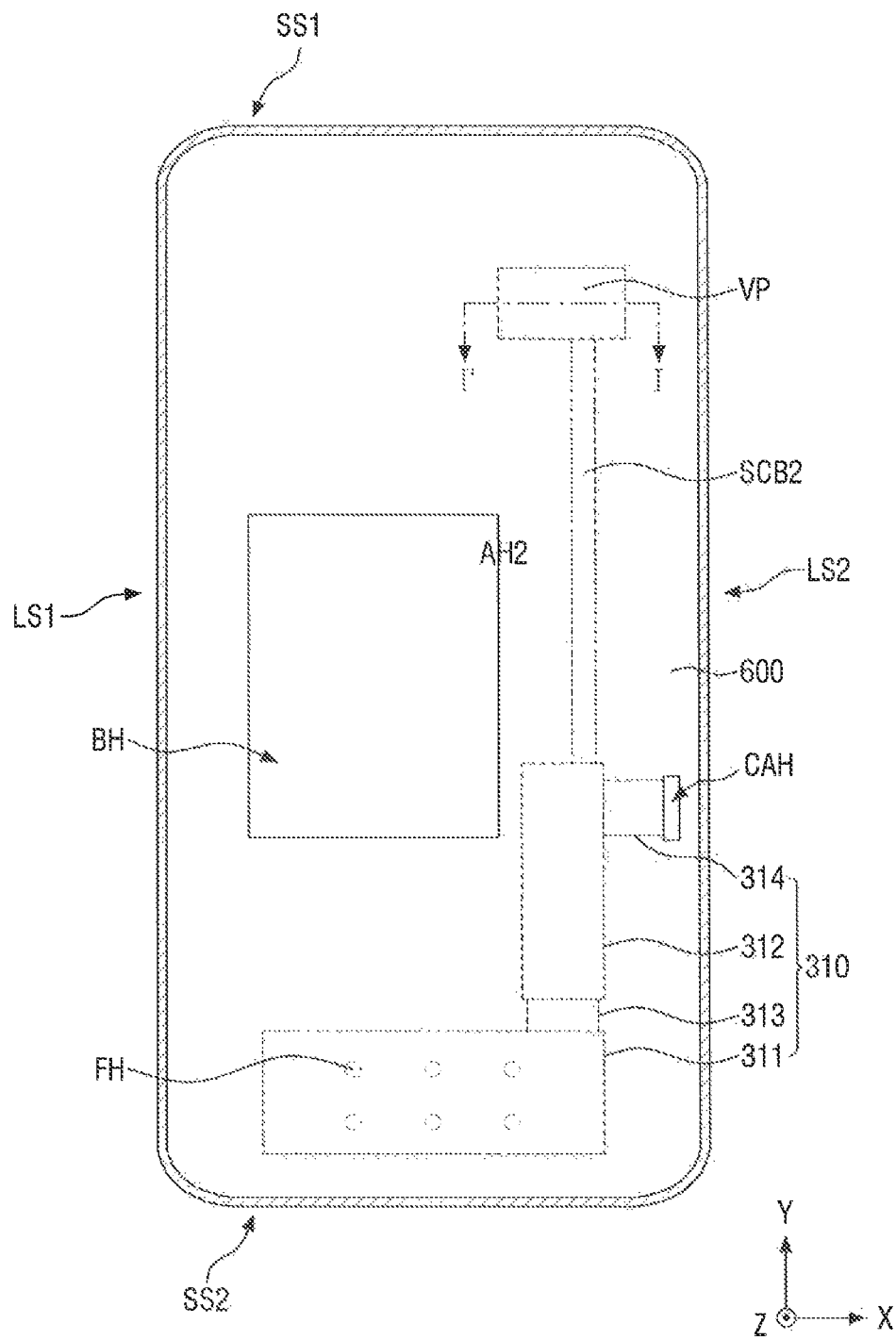
FIG. 4 is a plan view illustrating the display circuit board, a second connection cable, a vibrator, the first circuit board, the second circuit board, and a middle frame of the display device of FIG. 2.

The electronic permanent magnet EPM may be disposed in the first region DR1, but the present invention is not limited thereto. In addition, the electronic permanent magnet EPM may be disposed in the second regions DR2. In addition, FIGS. 2 through 4 illustrate that only one electronic permanent magnet EPM is provided, but the present invention is not limited thereto. In addition, multiple electronic permanent magnets EPM may be provided, in which case, the multiple electronic permanent magnets EPM may be disposed in the first region DR1, the second regions DR2, or both.

In an exemplary embodiment of the present invention, the electronic permanent magnet EPM may be disposed adjacent to the first short side SS1 and the first long side LS1, but the present invention is not limited thereto. In an exemplary embodiment of the present invention, the electronic permanent magnet EPM may be disposed adjacent to the first short side SS1 and in the middle of the first and second short sides LS1 and LS2. In an exemplary embodiment of the present invention, the electronic permanent magnet EPM may be disposed adjacent to the second short side SS1 and the first long side LS1. In an exemplary embodiment of the present invention, the electronic permanent magnet EPM may be disposed adjacent to the second short side SS1 and in the middle of the first and second long sides LS1 and LS2. The number and the locations of electronic permanent magnets EPM may vary depending on part of the display device 10 from which to output sound.

The middle frame 600 may be disposed below the panel bottom member 400. The middle frame 600 may include a synthetic resin, a metal, or both.

A first camera hole CMH1 in which a camera device 720 is inserted, a battery hole BH for releasing heat from a battery, and a through hole CAH that the second connection cable 314 passes through to be connected to the main circuit board 700 may be formed in the middle frame 600. In addition, the vibrator VP may be disposed on the middle frame 600. As illustrated in FIG. 6, the vibrator VP may be attached to the top surface of the middle frame 600 via a fifth adhesive member 950. For example, the fifth adhesive member 950 may be a PSA.

In an exemplary embodiment of the present invention, to minimize the influence of heat generated by the display panel 300, the electronic permanent magnet EPM may be connected to a first heat dissipation layer and/or a second heat dissipation layer of the panel bottom member 400. In addition, in a case where the electronic permanent magnet EPM and the vibrator VP overlap with the battery hole BH, heat from the electronic permanent magnet EPM and the vibrator VP may not be able to be properly released. Thus, the electronic permanent magnet EPM and the vibrator VP may be disposed not to overlap with the battery hole BH. For example, the electronic permanent magnet EPM may be disposed away from the battery hole BH. For example, the electronic permanent magnet EPM may be disposed adjacent to the first long side LS1 or the second long side LS2, while the battery hole BH is adjacent to the remaining long side of the first and second long sides LS1 and LS2. In an additional example, the electronic permanent magnet EPM may be disposed adjacent to the first short side SS1 or the second short side SS2, while the battery hole BH is adjacent to the remaining short side of the first and second short sides SS1 and SS2.

The vibrator VP may be disposed in the first region DR1, but the present invention is not limited thereto. In addition, the vibrator VP may be disposed in the second regions DR2. In addition, FIGS. 2 through 4 illustrate that only one vibrator VP is provided, but the present invention is not limited thereto. In addition, multiple vibrators VP may be provided, in which case, the multiple vibrators VP may be disposed in the first region DR1, the second region DR2, or both.

In an exemplary embodiment of the present invention, the vibrator VP may be disposed adjacent to the first short side SS1 and the first long side LS1, but the present invention is not limited thereto. In an exemplary embodiment of the present invention, the vibrator VP may be disposed adjacent to the first short side SS1 and in the middle of the first and second short sides LS1 and LS2. In an exemplary embodiment of the present invention, the vibrator VP may be disposed adjacent to the second short side SS1 and the first long side LS1. In an exemplary embodiment of the present invention, the vibrator VP may be disposed adjacent to the second short side SS1 and in the middle of the first and second long sides LS1 and LS2.

The vibrator VP and the electronic permanent magnet EPM may be disposed to be separated from each other in the third direction (or the Z-axis direction). In addition, the vibrator VP and the electronic permanent magnet EPM may be disposed to be separated from each other in the third direction (or the Z-axis direction), but in response to the electronic permanent magnet EPM being activated, the vibrator VP and the electronic permanent magnet EPM may be placed in contact with each other.

The vibrator VP may be disposed to overlap with the electronic permanent magnet EPM in a thickness direction, e.g., in the third direction (or the Z-axis direction). In a case where multiple vibrators VP and multiple electronic permanent magnets EPM are provided, the multiple vibrators VP and the multiple electronic permanent magnets EPM may be disposed to respectively overlap each other in the thickness direction, e.g., in the third direction (or the Z-axis direction), but the present invention is not limited thereto. In addition, some of the multiple vibrators VP and some of the multiple electronic permanent magnets EPM may overlap each other in the thickness direction, e.g., in the third direction (or the Z-axis direction), and the other vibrators VP and the other electronic permanent magnets EPM may not overlap each other in the thickness direction, e.g., in the third direction (or the Z-axis direction).

The vibrator VP may include a linear resonant actuator (LRA). In a case where the vibrator VP is driven as an LRA, the vibrator VP may vibrate in the third direction (or the Z-axis direction) and in the opposite direction of the third direction by pressing a mass connected to a spring, with a voice coil, in accordance with an alternating current (AC) voltage applied thereto, but the present invention is not limited thereto. In addition, the vibrator VP may include an exciter. In a case where the vibrator VP is driven as an exciter, the vibrator VP may generate a magnetic force using a voice coil and may thus vibrate the display panel 300 in the third direction (or the Z-axis direction) and in the opposite direction of the third direction.

The vibrator VP may output sound by vertically vibrating the display panel 300 while being in contact with the electronic permanent magnet EPM. In addition, the vibrator VP may provide a haptic feedback to the user by vibrating the middle frame 600 and the lower cover 900 while being separated from the electronic permanent magnet EPM. In this manner, sound can be output, and at the same time, a haptic feedback can be provided, by using the electronic permanent magnet EPM, which is attached to the panel bottom member 400, and the vibrator VP, which is attached to the top of the middle frame 600.

The electronic permanent magnet EPM may be connected to the first circuit board SCB1, and the vibrator VP may be connected to the second circuit board SCB2. For example, a first end of the first circuit board SCB1 may be connected to a pad area provided on at least one side of the electronic permanent magnet EPM. A first end of the second circuit board SCB2 may be connected to a sound pad area provided on at least one side of the vibrator VP.

The first circuit board SCB1 may be connected to a magnet driver 335 of the display circuit board 310, and the second circuit board SCB2 may be connected to a sound driver 330 of the display circuit board 310. Thus, the electronic permanent magnet EPM may be activated or deactivated in accordance with either a first-direction circulating current which is provided by the magnet driver 335 or a second-direction circulating current which is also provided by the magnet driver 335 and flows in the opposite direction to the first-direction circulating current, and the vibrator VP may output sound or provide a haptic feedback by vibrating in accordance with first and second driving voltages from the sound driver 330. The sound driver 330 may include a digital signal processor (DSP) which processes sound data, e.g., a digital signal, a digital-to-analog converter (DAC) which converts the digital signal processed by the DSP into an analog signal, and an amplifier (AMP) which amplifies and outputs the analog signal provided by the DAC.

A waterproof member 610 may be disposed along the edges of the middle frame 600. The waterproof member 610 may be attached to the top surface of the panel bottom member 400 and the bottom surface of the middle frame 600, and as a result, the penetration of moisture or dust between the display panel 300 and the middle frame 600 can be prevented by the waterproof member 400. For example, the display device 10 may be waterproof and dustproof.

For example, the waterproof member 610 may include a base film, a first adhesive film disposed on one surface of the base film, and a second adhesive film disposed on the other surface of the base film. The base film may include PET, PET and a cushion layer, or polyethylene (PE) foam. The first and second adhesive films may be PSAs. The first adhesive film may be attached to the bottom surface of the panel bottom member 400, and the second adhesive film may be attached to the top surface of the middle frame 600.

The main circuit board may be disposed on the middle frame 600. For example, the main circuit board 700 may be disposed below the middle frame 600. The main circuit board 700 may be a printed circuit board or a flexible printed circuit board.

The main circuit board 700 may include a main processor 710, the camera device 720, and a main connector 730. The main processor 710 and the main connector 730 may be disposed on the bottom surface of the main circuit board 700 to face the lower cover 900. The camera device 720 may be disposed on the top surface and/or the bottom surface of the main circuit board 700.

The main processor 710 may control the functions of the display device 10. For example, the main processor 710 may output image data to the display driver 320 of the display circuit board 310 for the display panel 300 to display an image. In addition, the main processor 710 may receive touch data from the touch driver 220, may determine the location of touch input from the user, and may execute an application corresponding to an icon displayed at the location of the touch input. In addition, the main processor 710 may receive touch data from the touch driver 220 and may execute an application corresponding to an icon displayed at the location of touch input from the user according to the touch data.

The main processor 710 may be an application processor a central processing unit, or a system chip, which consists of an integrated circuit.

The camera device 720 processes image frames provided by an image sensor in a camera mode, such as a still image or a moving image, and outputs the processed image frames to the main processor 710.

The second connection cable 314, which passes through a through hole CAH of the middle frame 600, may be connected to the main connector 730 of the main circuit board 700. As a result, the main circuit board 700 can be electrically connected to the display circuit board 310 and the touch circuit board 210.

The magnet driver 335 and the sound driver 330 of the display circuit board 310 receive sound data from the main processor 710. The magnet driver 335 activates the electronic permanent magnet EPM by providing the first-direction circulating current in accordance with the sound data. In addition, the sound driver 330 generates the first and second driving voltages in accordance with the sound data and provides the first and second driving voltages to the vibrator VP. The vibrator VP is attached to the electronic permanent magnet EPM, and thus, as the vibrator VP vibrates, the electronic permanent magnet EPM and the display panel 300 can also vibrate and can output sound.

The magnet driver 335 and the sound driver 330 receive haptic data from the main processor 710. The magnet driver 335 deactivates the electronic permanent magnet EPM by providing the second-direction circulating current, which flows in the opposite direction to the first-direction circulating current, in accordance with the haptic data. In addition, the magnet driver 335 generates an AC voltage in accordance with the haptic data, and provides the AC voltage to the vibrator VP via the second circuit board SCB2. Accordingly, the vibrator VP can vibrate while being separated from the electronic permanent magnet EPM and can provide a haptic feedback to the user.

A mobile communication module, which can exchange wireless signals with at least one of a base station, an external terminal, and a server via a mobile communication network, may be further provided on the main circuit board 700. The wireless signals may include various types of data associated with the transmission/reception of audio signals, video call signals, or text/multimedia messages.

The lower cover 900 may be disposed below the middle frame 600 and the main circuit board 700. The lower cover 900 may be coupled or fixed to the middle frame 600. The lower cover 900 may form the bottom exterior of the display device 100. The lower cover 900 may include, for example, plastic and/or a metal.

A second camera hole CMH2, in which the camera device 720 is inserted, may be formed in the lower cover 900. For example, the camera device 720 may protrude outwardly while in the second camera hole CMH2. The location of the camera device 720 and the locations of the first and second camera holes CMH1 and CMH2 corresponding to the camera device 720 are not limited to what is shown in FIG. 2.

According to the embodiment of FIGS. 1 and 2, not only sound, but also, a haptic feedback, can be provided to the user by using the electronic permanent magnet EPM, which is disposed on the bottom surface of the panel bottom member 400, and the vibrator VP, which is disposed on the top surface of the middle frame 600. Thus, a front speaker can be removed from the front of the display device 10. As a result, the size of an area of the display device 10 to display images can be increased at the front of the display device 10, and the waterproofness and dustproofness of the display device 10 can be increased. In addition, since the electronic permanent magnet EPM can perform a switching function by switching the circulation direction of a current, the electronic permanent magnet EPM does not need additional power and does not release heat.

Figure 5:
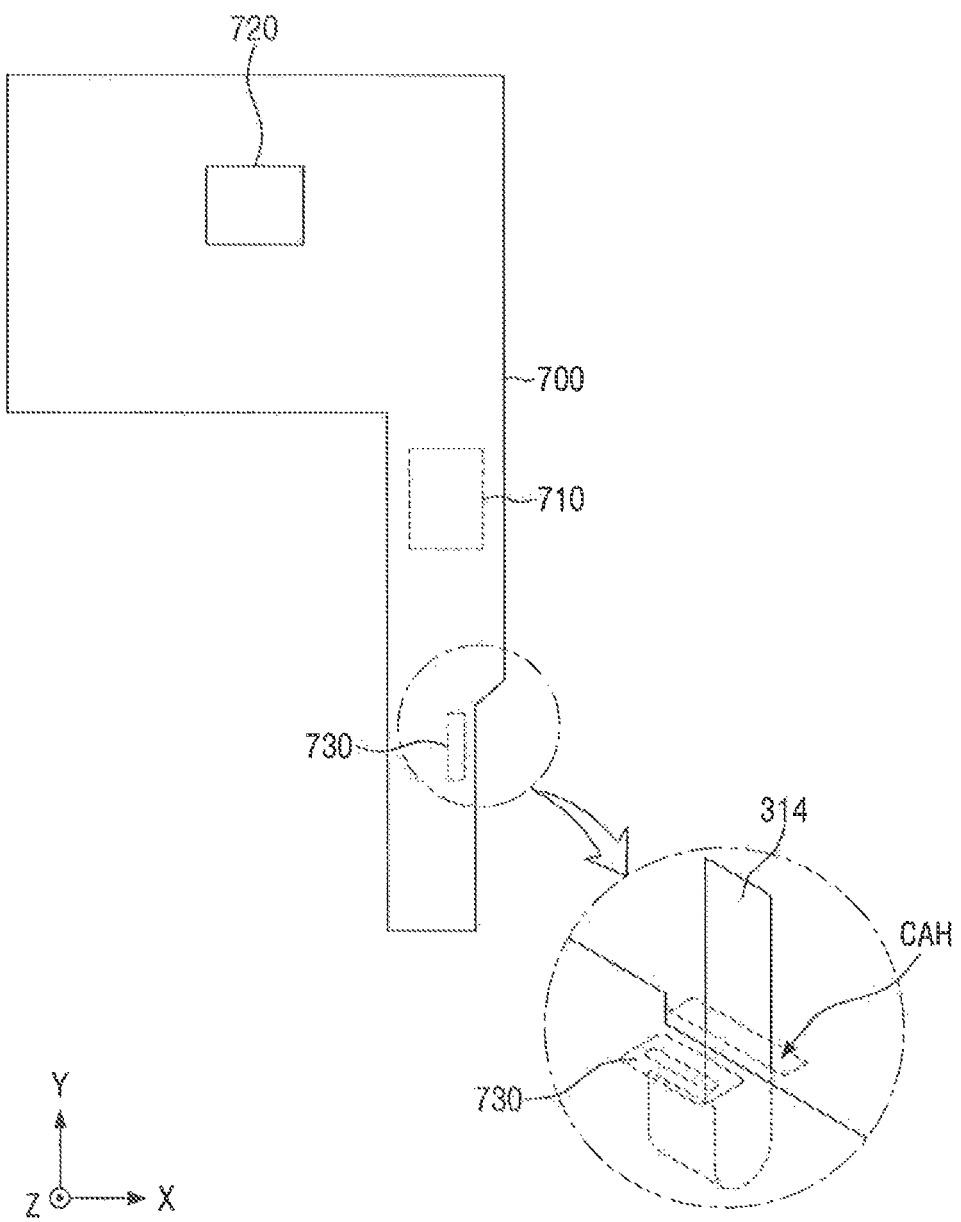
FIG. 5 is a plan view illustrating the second connection cable and a main circuit board of the display device of FIG. 2.

FIG. 3 is a bottom view illustrating the cover window, the touch circuit board, the display panel, the display circuit board, the panel bottom member, the electronic permanent magnet, the first circuit board, and the second circuit board of the display device of FIG. 2. FIG. 4 is a plan view illustrating the display circuit board, the second connection cable, the vibrator, the first circuit board, the second circuit board, and the middle frame of the display device of FIG. 2. FIG. 5 is a plan view illustrating the second connection cable and the main circuit board of the display device of FIG. 2.

It will hereinafter be described, with reference to FIGS. 3 through 5, how the first circuit board SCB1, which is connected to the electronic permanent magnet EPM, is connected to the display circuit board 310, how the second circuit board SCB2, which is connected to the vibrator VP, is connected to the display circuit board 310, and how the second connection cable 314, which is connected to the display circuit board 310, is connected to the main connector 730 of the main circuit board 700.

Referring to FIGS. 3 through 5, the first end of the first circuit board SCB1 may be connected to at least one side of the electronic permanent magnet EPM, and the second end of the first circuit board SCB1 may be connected to the display circuit board 310 and may thus be connected to the magnet driver 335.

The first end of the second circuit board SCB2 may be connected to the sound pad area provided on at least one side of the vibrator VP. The sound pad area provided on at least one side of the vibrator VP may include pad electrodes. For example, the first end of the second circuit board SCB2 may be connected to each of the pad electrodes of the sound pad area provided on at least one side of the vibrator VP. The second end of the second circuit board SCB2 may be connected to the display circuit board 310 and may thus be connected to the sound driver 330.

The display circuit board 310 may include a first display circuit board 311, a second display circuit board 312, and a first connection cable 313.

The first display circuit board 311 may be attached to one side of the top or bottom surface of the display panel 300 and may be bent toward the bottom surface of the display panel 300. For example, the first display circuit board 311 may be bent around the display panel 300. As illustrated in FIG. 4, the first display circuit board 311 may be fixed into fixing holes FH, which are formed in the middle frame 600, by fixing members.

The first display circuit board 311 may include the display driver 320 and a first connector 311a. The display driver 320 and the first connector 311a may be disposed on one surface of the first display circuit board 311. For example, the display driver 320 and the first connector 311a may be disposed on the same surface as one another or on different surfaces from one another.

The first connector 311a may be connected to a first end of the first connection cable 313 connected to the second display circuit board 312. As a result, the display driver 320 mounted on the first circuit board 311 can be electrically connected to the second display circuit board 312 via the first connection cable 313.

The second display circuit board 312 may include the magnet driver 335, the sound driver 330, the touch connector 312a, a first connection connector 312b, and a second connection connector 312c. The first and second connection connectors 312b and 312c may be disposed on one surface of the second display circuit board 312. In addition, the touch connector 312a, the magnet driver 335, and the sound driver 330 may be disposed on the other surface of the second display circuit board 312. However, the present invention is not limited thereto. In addition, the magnet driver 335 and the sound driver 330, like the display driver 320, may be disposed on the first display circuit board 311. The magnet driver 335 and the sound driver 330 of FIG. 3 may be integrated into a single vibration driver.

The touch connector 312a may be connected to the touch connecting portion provided at one end of the touch circuit board 210. As a result, the touch driver 220 can be electrically connected to the second display circuit board 312. The first and second circuit boards SCB1 and SCB2 may also be connected to the second display circuit board 312, but the present invention is not limited thereto. In an exemplary embodiment of the present invention, the first and second circuit boards SCB1 and SCB2 may be connected to the first display circuit board 311. In an exemplary embodiment of the present invention, the first circuit board SCB1 may be connected to the second display circuit board 312, and the second circuit board SCB2 may be connected to the first display circuit board 311.

The first connection connector 312b may be connected to a second end of the first connection cable 313 connected to the first display circuit board 311. As a result, the display driver 320 mounted on the first display circuit board 311 can be electrically connected to the second display circuit board 312 via the first connection cable 313.

The second connection connector 312c may be connected to a first end of the second connection cable 314 connected to the main connector 730 of the main circuit board 700. As a result, the second display circuit board 312 can be electrically connected to the main circuit board 700 via the second connection cable 314.

A connector connection portion 315 may be formed at a second end of the second connection cable 314. As illustrated in FIG. 4, the connector connection portion 315 of the second connection cable 314 may extend to the bottom of the middle frame 600 through the through hole CAH of the middle frame 600. In addition, as illustrated in FIG. 5, the connector connecting portion 315 of the second connection cable 314 passing through the through hole CAH may extend to the bottom of the main circuit board 700 through the gap between the middle frame 600 and the main circuit board 700. Further, as illustrated in FIG. 5, the connector connecting portion 315 of the second connection cable 314 may be connected to the main connector 730, which is disposed on the bottom surface of the main circuit board 700.

In addition, as illustrated in FIGS. 3 through 5, the second connection cable 314, which is connected to the display circuit board 310, may extend to the bottom of the middle frame 600 through the through hole CAH of the middle frame 600 and may thus be connected to the main connector 730 of the main circuit board 700. Accordingly, the display circuit board 310 and the main circuit board 700 can be stably connected to each other.

FIG. 6 is a cross-sectional view taken along line I-I' of the display device of FIGS. 3 and 4.

The cover window 100, the touch sensing device 200, the display panel 300, the panel bottom member 400, the first adhesive member 910, the second adhesive member 920, and the third adhesive member 930 have already been described in detail with reference to FIGS. 1 and 2, and thus, detailed descriptions thereof may be omitted.

Referring to FIG. 6, the electronic permanent magnet EPM is disposed on the panel bottom member 400. For example, the electronic permanent magnet EPM may be disposed to below the panel bottom member 400. As an additional example, the electronic permanent magnet EPM may be attached to the bottom surface of the panel bottom member 400 via the fourth adhesive member 940. For example, the fourth adhesive member 940 may be a PSA, but the present invention is not limited thereto. Various materials having adhesiveness may be used as the fourth adhesive member 940.

The vibrator VP is disposed on the middle frame 600. For example, the vibrator VP may be disposed above the middle frame 600. As an example, the vibrator VP may be attached to the top surface of the middle frame 600 via the fifth adhesive member 950. For example, the fifth adhesive member 950 may be a PSA, but the present invention is not limited thereto. Various materials having adhesiveness may be used as the fifth adhesive member 950.

The electronic permanent magnet EPM and the vibrator VP may be disposed to have a distance d therebetween in the third direction, with reference to FIG. 6. For example, the distance d between the electronic permanent magnet EPM and the vibrator VP may be greater than the vibration displacement (VD) of the vibrator VP. Here, the VD may be half the advance width (PTP) of the vibrator VP vibrating in the third direction (or the Z-axis direction). For example, the VD may be the distance by which the vibrator VP and the electronic permanent magnet EPM are not in touch with each other when the vibrator VP vibrates during a state where the electronic permanent magnet EPM is deactivated. Further, when the electronic permanent magnet EPM is in the inactivation state, a distance between the vibrator VP and the electronic permanent magnet EPM is greater than the VD of the vibrator VP; however, the present invention is not limited thereto. In addition, the distance d may be defined as the distance by which the vibrator VP is moved to be attached to the electronic permanent magnet EPM by a magnetic force generated when the electronic permanent magnet EPM is activated.

The electronic permanent magnet EPM and the vibrator VP may overlap with each other in the third direction (or the Z-axis direction). In an exemplary embodiment of the present invention, the electronic permanent magnet EPM and the vibrator VP may have the same width as each other in the second direction (or the Y-axis direction), but the present invention is not limited thereto. In an exemplary embodiment of the present invention, the width, in the second direction (or the Y-axis direction), of the vibrator VP may be greater than the width, in the second direction (or the Y-axis direction), of the electronic permanent magnet EPM. In an exemplary embodiment of the present invention, the width, in the second direction (or the Y-axis direction), of the electronic permanent magnet EPM may be greater than the width, in the second direction (or the Y-axis direction), of the vibrator VP.

In an exemplary embodiment of the present invention, the height, in the third direction (or the Z-axis direction), of the electronic permanent magnet EPM may be smaller than the height, in the third direction (or the Z-axis direction), of the vibrator VP, but the present invention is not limited thereto. In an exemplary embodiment of the present invention, the height, in the third direction (or the Z-axis direction), of the electronic permanent magnet EPM may be greater than, or the same as, the height, in the third direction (or the Z-axis direction), of the vibrator VP.

Figure 7:
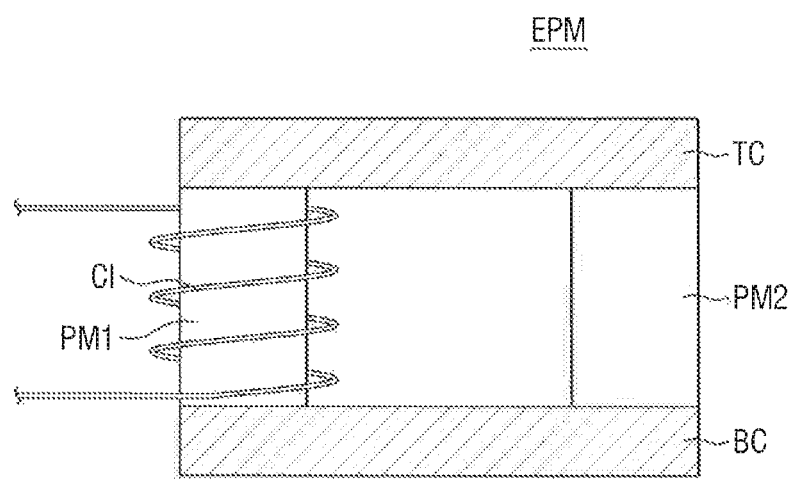
FIG. 7 is a cross-sectional view of an electronic permanent magnet of the display device of FIG. 2.

FIG. 7 is a cross-sectional view of the electronic permanent magnet of the display device of FIG. 2.

Referring to FIG. 7, the electronic permanent magnet EPM includes a first magnet PM1 which can be selectively switched between a first polarity and a second polarity that is opposite to the first polarity, a second magnet PM2 which is adjacent to the first magnet PM1 and is fixed to the first polarity, a top cover TC which is in contact with the top surfaces of the first and second magnets PM1 and PM2, a bottom cover BC which is in contact with the bottom surfaces of the first and second magnets PM1 and PM2, and a coil CI which is wound around the first magnet PM1.

The first magnet PM1 may be a control magnet whose polarity changes in accordance to with the direction of a current flowing in the coil CI. For example, the first magnet PM1 may include a magnetically semi-hard material such as an aluminum-nickel-cobalt (AlNiCo) alloy. In this example, the first magnet PM1 may have sufficient remanence, and thus, once the electronic permanent magnet EPM is activated by applying a current to the first magnet PM1, the electronic permanent magnet EPM can remain activated without the need to additionally apply a current. Accordingly, additional power for maintaining the electronic permanent magnet EPM to be activated is not needed. The activation of the electronic permanent magnet EPM means that the magnetic fields of the first and second magnets PM1 and PM2 are in the same direction. In addition, when the electronic permanent magnet EPM is deactivated, the magnetic fields of the first and second magnets PM1 and PM2 are in opposite directions and offset each other.

The second magnet PM2 may be a fixed magnet whose polarity does not change. In an exemplary embodiment of the present invention, the second magnet PM2 may include a magnetically hard material such as neodymium (Nd). For example, the second magnet PM2 may be a neodymium-iron-boron (Nd—Fe—B) magnet.

In an exemplary embodiment of the present invention, the material of the first magnet PM1 may have a coercivity value of about 30 KA/m to about 100 KA/m, and the material of the second magnet PM2 may have a coercivity value of about 800 KA/m to about 950 KA/m. In this case, the materials of the first and second magnets PM1 and PM2 may have a magnetic field strength of about 0.1 Tesla to about 1 Tesla or about 1 Tesla to about 10 Tesla and can attract the vibrator VP, but the present invention is not limited thereto. The coercivity values of the materials of the first and second magnets PM1 and PM2 may vary depending on the size of the vibrator VP, the distance d between the electronic permanent magnet EPM and the vibrator VP, and the mass of the middle frame 600 to which the vibrator VP is attached.

FIG. 7 illustrates that a single first magnet PM1 and a single second magnet PM2 are provided in the electronic permanent magnet EPM, but the present invention is not limited thereto. In addition, multiple first magnets PM1 and multiple second magnets PM2 may be provided in the electronic permanent magnet EPM, and the number of first magnets PM1 may differ from the number of second magnets PM2.

The top cover TC may be disposed above the first and second magnets PM1 and PM2, and the bottom cover BC may be disposed below the first and second magnets PM1 and PM2. The top cover TC and the bottom cover BC may be in contact with the first and second magnets PM1 and PM2 and may stably fix the locations of the first and second magnets PM1 and PM2. For example, the top cover TC and the bottom cover BC may be formed of a metal, but the present invention is not limited thereto.

The top cover TC may be attached to the panel bottom member 400 via the fourth adhesive member 940, and the bottom cover BC may be placed in contact with the top surface of the vibrator VP when the electronic permanent magnet EPM is activated.

The coil CI may be wound around the first magnet PM1. The coil CI may magnetize the material of the first magnet PM1 by synchronizing the direction of the magnetic field of the first magnet PM1 with the direction of the magnetic field that it generates. For example, the coil CI may include Cu, and as a current passes through the coil CI, the coil may generate a magnetic field. The magnetic field generated by the coil CI does not affect the second magnet PM2.

In an exemplary embodiment of the present invention, the coil CI may be wound around each of the first and second magnets PM1 and PM2. Since the second magnet PM2 includes a magnetically hard material, the second magnet PM2 is not affected at all, or is affected only slightly, by the current passing through the coil CI, and thus, the activation of the electronic permanent magnet EPM is not affected.

Figure 8:
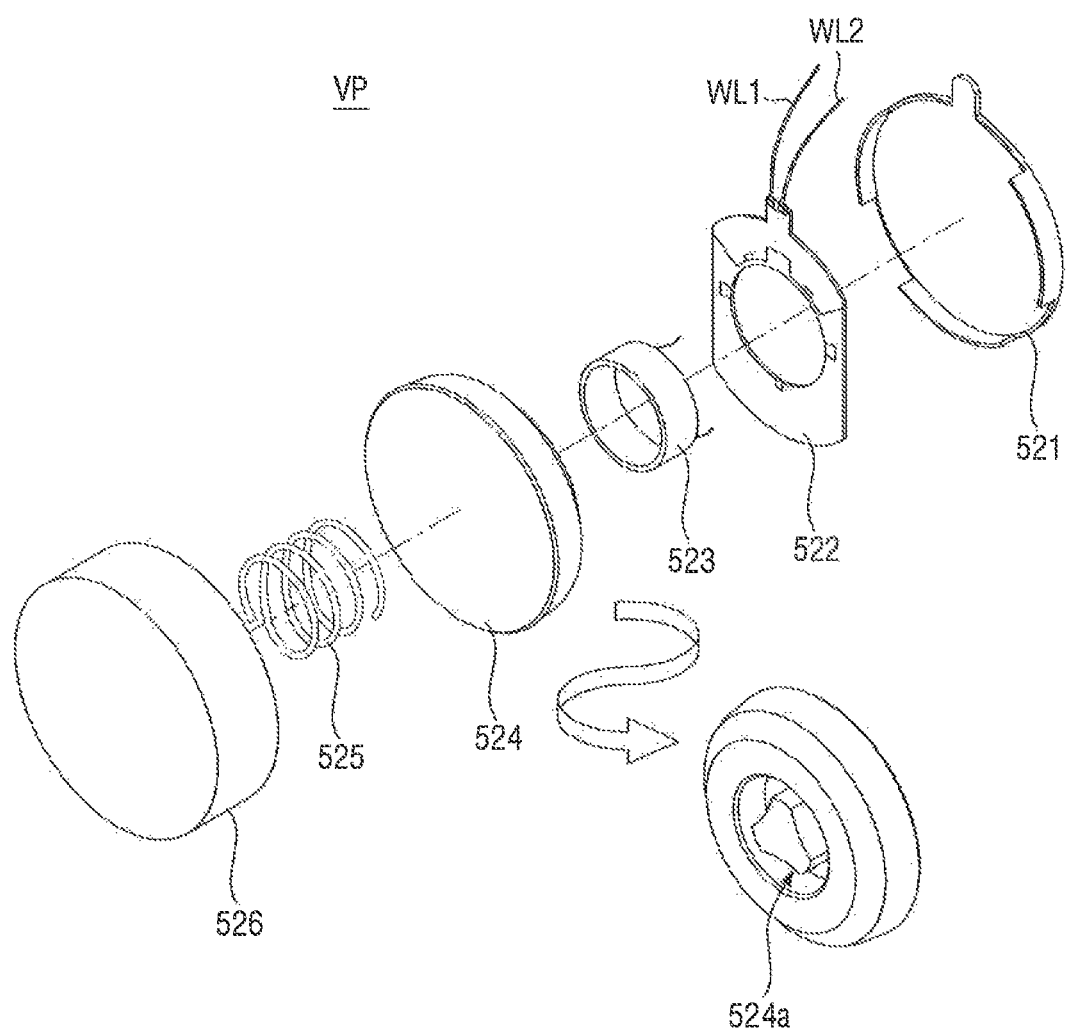
FIG. 8 is a perspective view of a vibrator of the display device of FIG. 2.
Figure 9:
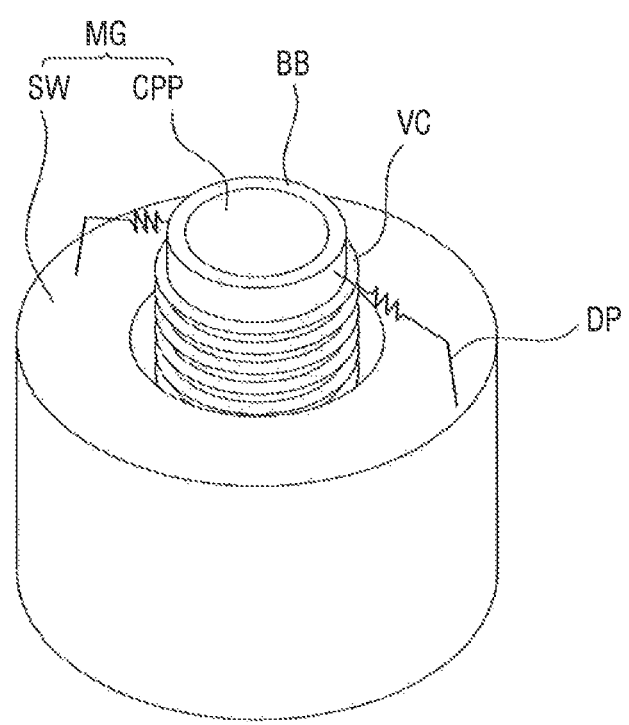
FIG. 9 is a perspective view of a modified example of the vibrator of the display device of FIG. 2.

FIG. 8 is a perspective view of the vibrator of the display device of FIG. 2, and FIG. 9 is a perspective view of a modified example of the vibrator of the display device of FIG. 2.

Referring to FIG. 8, in an exemplary embodiment of the present invention, the vibrator VP may be an LRA that can vibrate in the third direction (or the Z-axis direction) by generating a magnetic force using a voice coil.

In a case where the vibrator VP is an LRA, the vibrator VP may include a lower chassis 521, a flexible printed circuit board 522, a voice coil 523, a magnet 524, a spring 525, and an upper chassis 526. The lower and upper chassis 521 and 526 may be formed of a metal material. The flexible printed circuit board 522 may be disposed on a surface of the lower chassis 521 that faces the upper chassis 526 and may be connected to first and second sound wires WL1 and WL2. The voice coil 523 may be connected to a surface of the flexible printed circuit board 522 that faces the upper chassis 526. Accordingly, one end of the voice coil 523 may be electrically connected to the first sound wire WL1, and the other end of the voice coil 523 may be electrically connected to the second sound wire WL2. The magnet 524 may be a permanent magnet, and a voice coil groove 524*a*, in which the voice coil 523 is received, may be formed on a surface of the magnet 524 that faces the voice coil 523. A spring 525 may be disposed between the magnet 524 and the upper chassis 526.

The direction of a current that flows in the voice coil 523 of the vibrator VP may be controlled in accordance with first and second driving voltages applied to the first and second sound wires WL1 and WL2. A magnetic field may be formed around the voice coil 523 depending on the current that flows in the voice coil 523. For example, the direction of the current that flows in the voice coil 523, when the first driving voltage is a positive voltage and the second driving voltage is a negative voltage, may be opposite to the direction of the current that flows in the voice coil 523 when the first driving voltage is a negative voltage and the second driving voltage is a positive voltage. As the first and second driving voltages are alternately driven, an attracting force and a repulsive force may be applied to the magnet 524 and the voice coil 523 so that the magnet 524 can reciprocate between the voice coil 523 and the upper chassis 526 due to the spring 525. As a result, the vibration surface disposed on the upper chassis 526 can vibrate, and sound can be output.

Referring to FIG. 9, in an exemplary embodiment of the present invention, a vibrator VP_1 may be an exciter vibrating the panel bottom member 400 and the display panel 300 by generating a magnetic force using a voice coil. In this case, the vibrator VP_1 may include a magnet MG, a bobbin BB, a voice coil VC, and dampers DP.

The magnet MG may be a permanent magnet, and a sintered magnet such as a barium ferrite magnet may be used. For example, the magnet MG may be formed as a ferric trioxide ($Fe_2O_3$) magnet, a barium carbonate ($BaCO_3$) magnet, a Nd magnet, a strontium ferrite magnet with an improved magnetic component, or an aluminum (Al), Ni, or cobalt (Co) cast alloy magnet, but the present invention is not limited thereto. The Nd magnet may be, for example, a Nd—Fe—B magnet.

The magnet MG may include a plate, a central protruding part CPP protruding from the center of the plate, and a sidewall part SW protruding from the edge of the plate. The central protruding part CPP and the sidewall part SW may be a predetermined distance apart from each other, and as a result, a predetermined space may be formed between the central protruding part CPP and the sidewall part SW. For example, the magnet MG may have a cylindrical shape. For example, the magnet MG may be in the shape of a cylinder with a circular space or opening formed at one of the bases thereof.

The central protruding part CPP of the magnet MG may have N-pole magnetism, and the plate and the sidewall part SW may have S-pole magnetism. As a result, an external magnetic field may be formed between the central protruding part CPP and the plate of the magnet MG and between the central protruding part CPP and the sidewall part SW of the magnet MG.

The bobbin BB may be formed into a cylindrical shape. The central protruding part CPP of the magnet MG may be disposed in the bobbin BB. For example, the bobbin BB may be disposed to surround the central protruding part CPP of the magnet MG. The sidewall part SW of the magnet MG may be disposed on the outside of the bobbin BB. For example, the sidewall part SW of the magnet MG may be disposed to surround the bobbin BB. Spaces may be formed between the bobbin BB and the sidewall part SW of the magnet MG. In an exemplary embodiment of the present invention, spaces may also be formed between the bobbin BB and the central protruding part CPP of the magnet MG.

For example, the bobbin BB may be formed of a pulp- or paper-processed material, Al, Mg, or an alloy thereof, a synthetic resin such as polypropylene, or polyamide-based fibers.

The voice coil VC may be wound around the outer circumferential surface of the bobbin BB. One end of the voice coil VC adjacent to one end of the bobbin BB may be connected to a first sound wire, and the other end of the voice coil VC adjacent to the other end of the bobbin BB may be connected to a second sound wire. As a result, a current may flow in the voice coil VC in accordance with first and second driving voltages applied to the first and second sound wires, respectively. An applied magnetic field may be formed around the voice coil VC depending on the current that flows in the voice coil VC. For example, the direction of the current that flows in the voice coil VC, when the first driving voltage is a positive voltage and the second driving voltage is a negative voltage, may be opposite to the direction of the current that flows in the voice coil VC when the first driving voltage is a negative voltage and the second driving voltage is a positive voltage. As the first and second driving voltages are alternately driven, the N pole and the S pole of the applied magnetic field may be changed so that an attractive force and a repulsive force can be alternately applied to the magnet MG and the voice coil VC. Accordingly, the bobbin BB, which has the voice coil VC wound therearound, can reciprocate in the third direction (or the Z-axis direction). As a result, the panel bottom member 400 and the display panel 300 can vibrate in the third direction (or the Z-axis direction), and sound can be output.

The dampers DP may be connected to the bobbin BB and the sidewall part SW. For example, the dampers DP may be disposed between the top of the bobbin BB and the sidewall part SW of the magnet MG. Further, as an example, the dampers DP may be disposed on an upper surface of the sidewall part SW and on a side surface of the bobbin BB. The dampers DP may contract or expand in accordance with the vertical movement of the bobbin BB and may thus control the vertical vibration of the bobbin BB. For example, since the dampers DP are connected between the bobbin BB and the sidewall part SW of the magnet MG, the vertical movement of the bobbin BB may be limited by the restoring force of the dampers DP. For example, when the bobbin BB vibrates above or below a predetermined height, the bobbin BB can return to its original location due to the restoring force of the dampers DP. In an exemplary embodiment of the present invention, since the vibrator VP_1 may be implemented as a piezoelectric actuator and an exciter that can vibrate vertically, a tweeter for outputting sound having a high sound pressure level (dB) in a high-frequency range can be realized.

Figure 10:
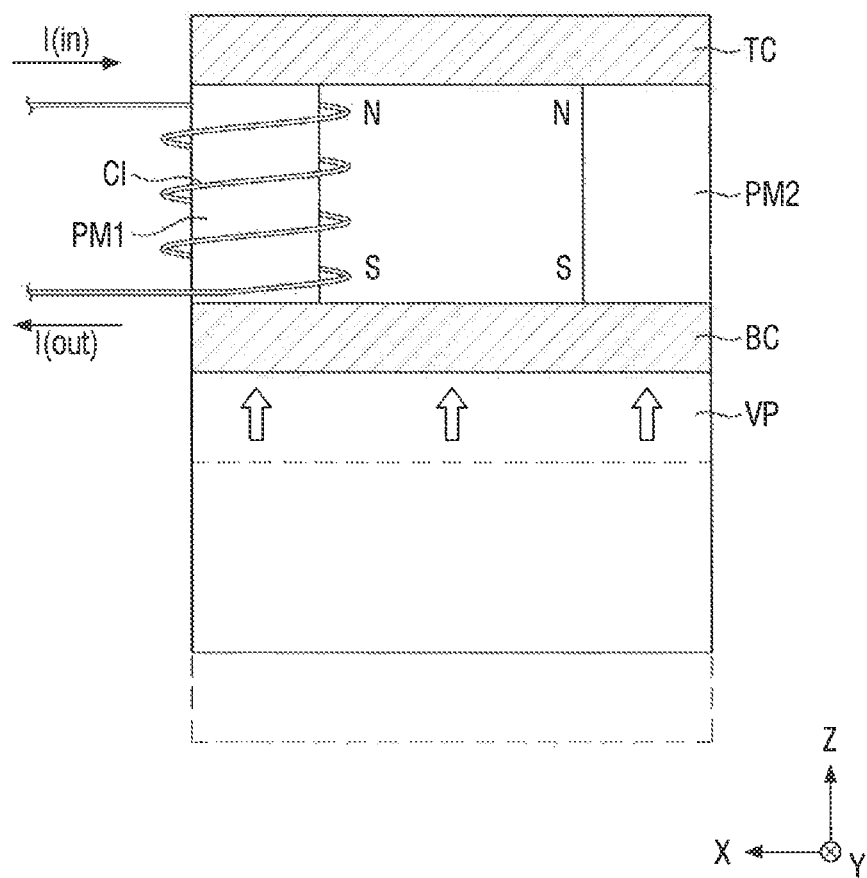
FIG. 10 is a cross-sectional view illustrating the electronic permanent magnet and the vibrator of the display device of FIG. 2 in a state where the electronic permanent magnet of the display device of FIG. 2 is activated.
Figure 11:
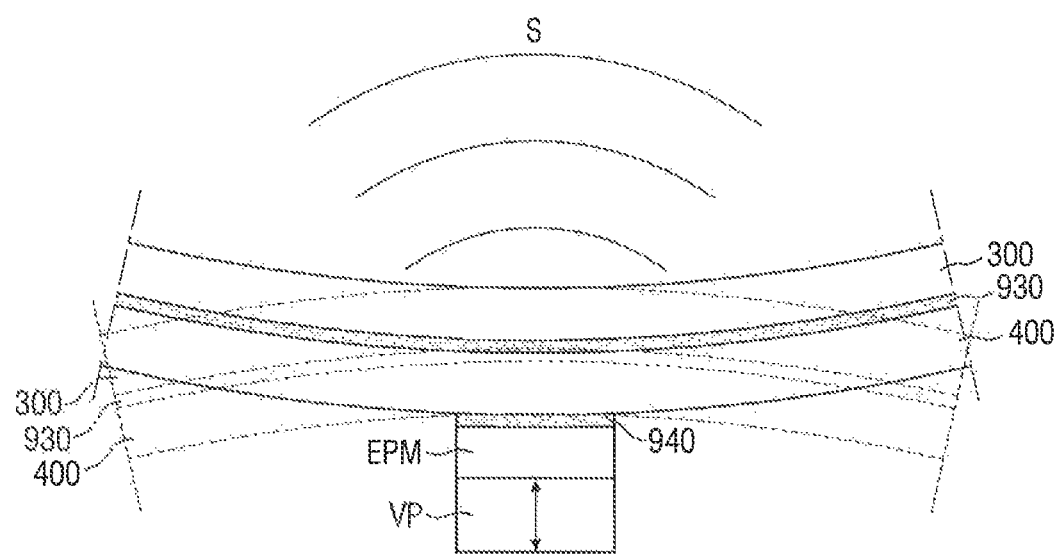
FIG. 11 is a cross-sectional view of how sound is generated by the electronic permanent magnet and the vibrator of the display device of FIG. 2.
Figure 13:
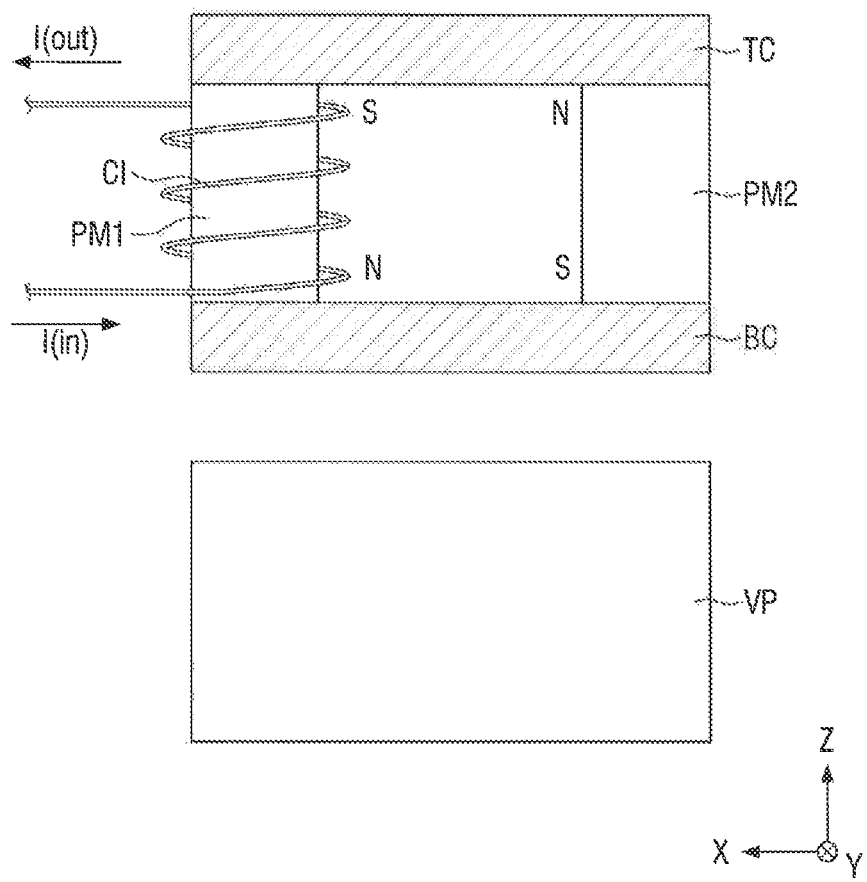
FIG. 13 is a cross-sectional view illustrating the electronic permanent magnet and the vibrator of the display device of FIG. 2 in a state where the electronic permanent magnet of the display device of FIG. 2 is inactive.
Figure 14:
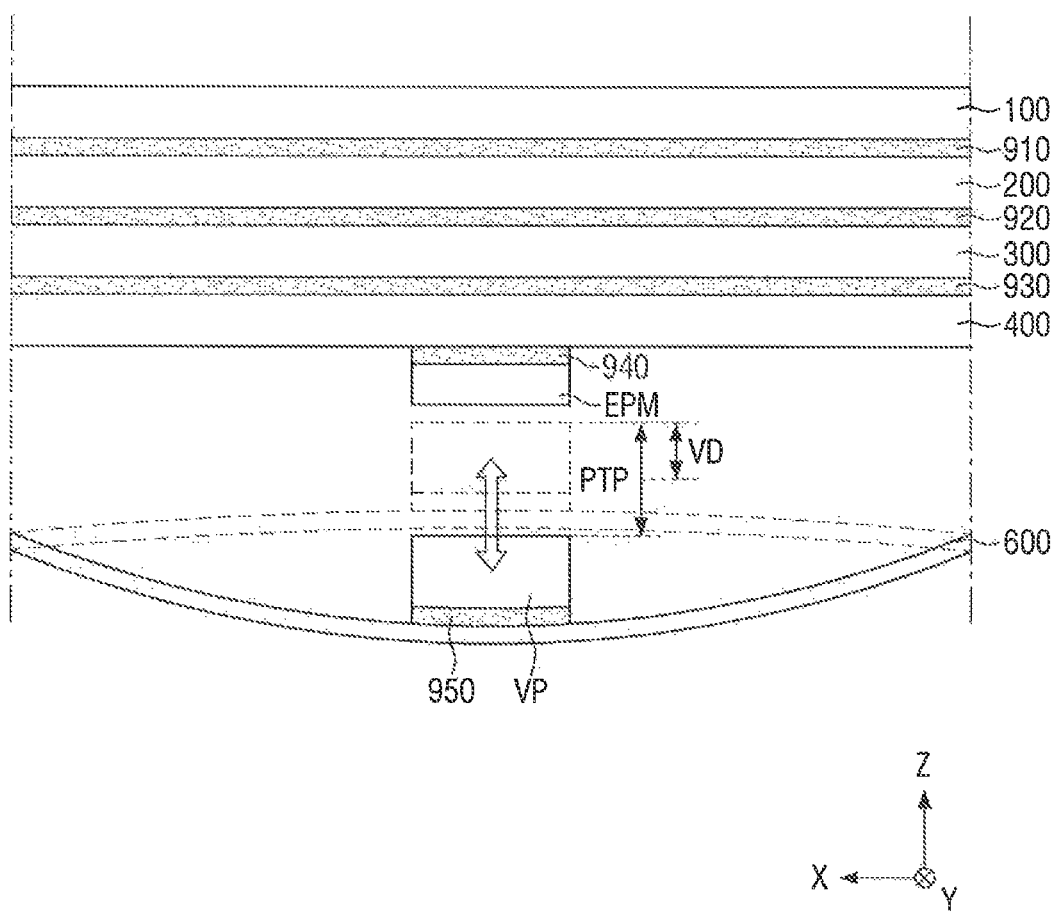
FIG. 14 is a cross-sectional view illustrating how a haptic effect is realized by the vibrator of the display device of FIG. 2.
Figure 15:
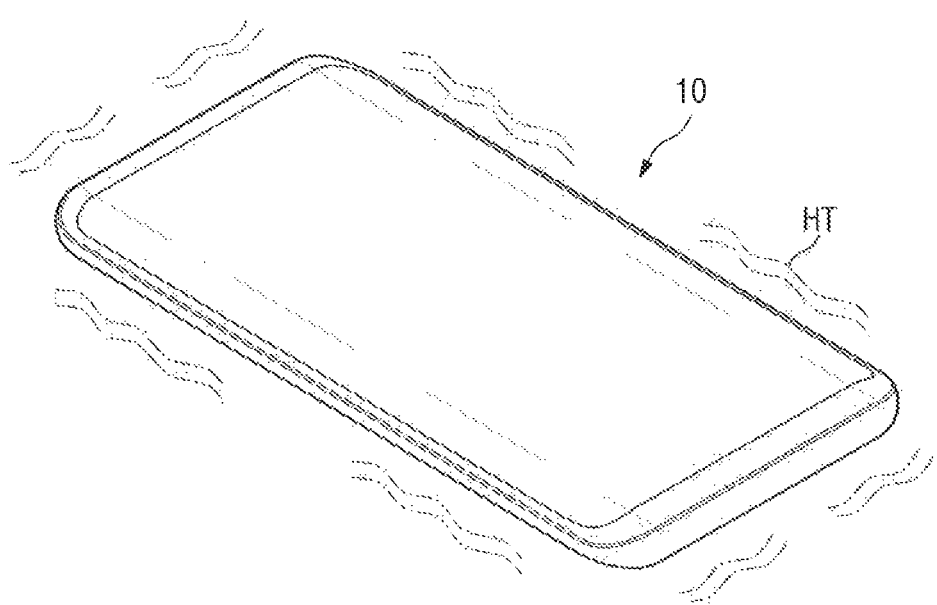
FIG. 15 is a perspective view illustrating how the display device of FIG. 1 provides a haptic effect.
Figure 16:
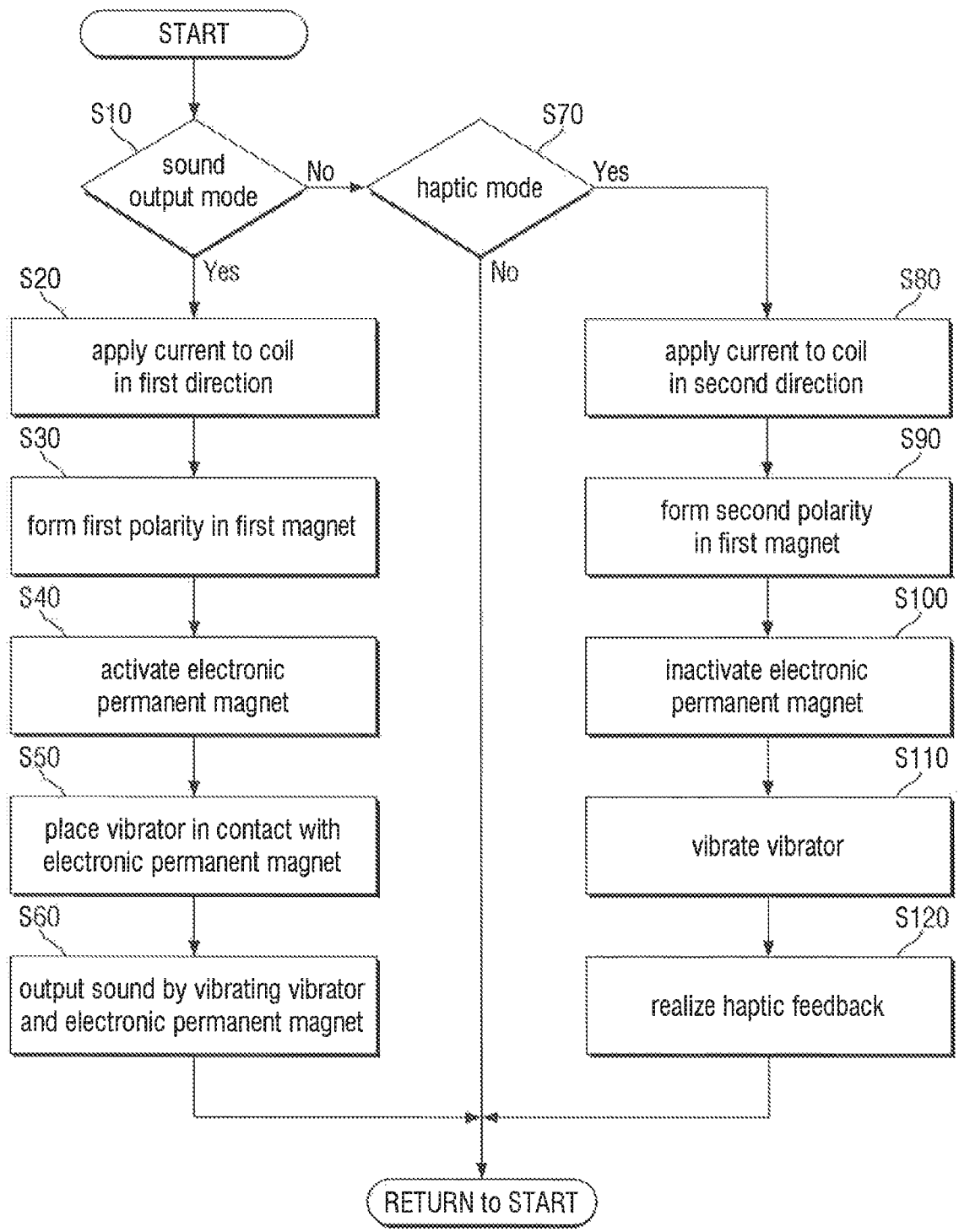
FIG. 16 is a flowchart illustrating a sound output mode and a haptic mode according to an exemplary embodiment of the present invention.

FIG. 10 is a cross-sectional view illustrating the electronic permanent magnet and the vibrator of the display device of FIG. 2 in a state where the electronic permanent magnet of the display device of FIG. 2 is activated, FIG. 11 is a cross-sectional view of how sound is generated by the electronic permanent magnet and the vibrator of the display device of FIG. 2, FIG. 12 is a perspective view illustrating how the display device of FIG. 1 outputs sound, FIG. 13 is a cross-sectional view illustrating the electronic permanent magnet and the vibrator of the display device of FIG. 2 in a state where the electronic permanent magnet of the display device of FIG. 2 is inactive, FIG. 14 is a cross-sectional view illustrating how a haptic effect is realized by the vibrator of the display device of FIG. 2, FIG. 15 is a perspective view illustrating how the display device of FIG. 1 provides a haptic effect, and FIG. 16 is a flowchart illustrating a sound output mode and a haptic mode according to an exemplary embodiment of the present invention.

Referring to FIGS. 10 through 12 and 16, the top of the second magnet PM2 of the electronic permanent magnet EPM may be fixed to a north (N) pole, and the bottom of the second magnet PM2 may be fixed to a south (S) pole. In the sound output mode (S10), a current I(in) is applied to the coil CI, which is wound around the first magnet PM1, in one direction (S20). Here, the current I(in) may be an AC, and the one direction may be the direction in which the current I(in) flows in the coil CI through the top of the coil CI and then a current I(out) flows out of the coil CI through the bottom of the coil CI. When the current I(in) passes through the coil CI, a magnetic field is generated, and the material of the first magnet PM1 is magnetized. As a result, the first magnet PM1 is switched to the first polarity (S30). For example, the top of the first magnet PM1 may be magnetized to the N pole, and the bottom of the first magnet PM1 may be magnetized to the S pole. Accordingly, the directions of the magnetic fields of the first and second magnets PM1 and PM2 coincide, and the electronic permanent magnet EPM is activated (S40). Due to a magnetic force generated by the activated electronic permanent magnet EPM, the vibrator VP is pulled in the thickness direction, e.g., in the third direction (or the Z-axis direction), to be in contact with the bottom surface of the electronic permanent magnet EPM (S50).

While the electronic permanent magnet EPM and the vibrator VP are being in contact with each other, the vibrator VP vibrates in the third direction (or the Z-axis direction) and in the opposite direction of the third direction, thereby vibrating the panel bottom member 400 and the display panel 300. As a result, the display device 10 can output sound (S60). Accordingly, since a front speaker can be removed from the front of the display device 10, the size of an area to display images can be increased at the front of the display device 10. In addition, since a speaker hole for forming a speaker can also be removed, the waterproofness and dustproofness of the display device 10 can be increased. In addition, additional power is not needed to maintain the electronic permanent magnet EPM to be activated.

Referring to FIGS. 13 through 16, as already mentioned above, the top of the second magnet PM2 of the electronic permanent magnet EPM may be fixed to the N pole, and the bottom of the second magnet PM2 may be fixed to the S pole. In the haptic mode (S70), the current I(in) is applied to the coil CI, which is wound around the first magnet PM1, in other direction (e.g., the opposite direction of the direction illustrated in FIG. 10) (80). Here, the other direction may be the direction in which the current I(in) flows in the coil CI through the bottom of the coil CI and then the current I(out) flows out of the coil CI through the top of the coil CI. When the current I(in) passes through the coil CI, a magnetic field is generated, and the material of the first magnet PM1 is magnetized. As a result, the top of the first magnet PM1 may be switched to the second polarity, which is opposite to the first polarity. For example, the top of the first magnet PM1 may be switched to the S pole, and the bottom of the first magnet PM1 may be switched to the N pole (S90). Accordingly, the directions of the magnetic fields of the first and second magnets PM1 and PM2 become opposites of one another and offset each other, and the electronic permanent magnet EPM is deactivated (S100). In response to the electronic permanent magnet EPM being deactivated, the vibrator VP returns to its original location, and the electronic permanent magnet EPM and the vibrator VP are separated from each other.

While the electronic permanent magnet EPM and the vibrator VP are being separated, the vibrator VP vibrates in the third direction (or the Z-axis direction) and in the opposite direction of the third direction (S110), thereby vibrating the middle frame 600 and the elements of the display device 10 that are connected to the middle frame 600. As a result, a haptic effect can be provided (S120). Since the display panel 300 is not vibrated directly to provide a haptic feedback, the degradation of display quality by vibration can be prevented, and noise that may be caused by a haptic effect can be reduced.

Figure 17:
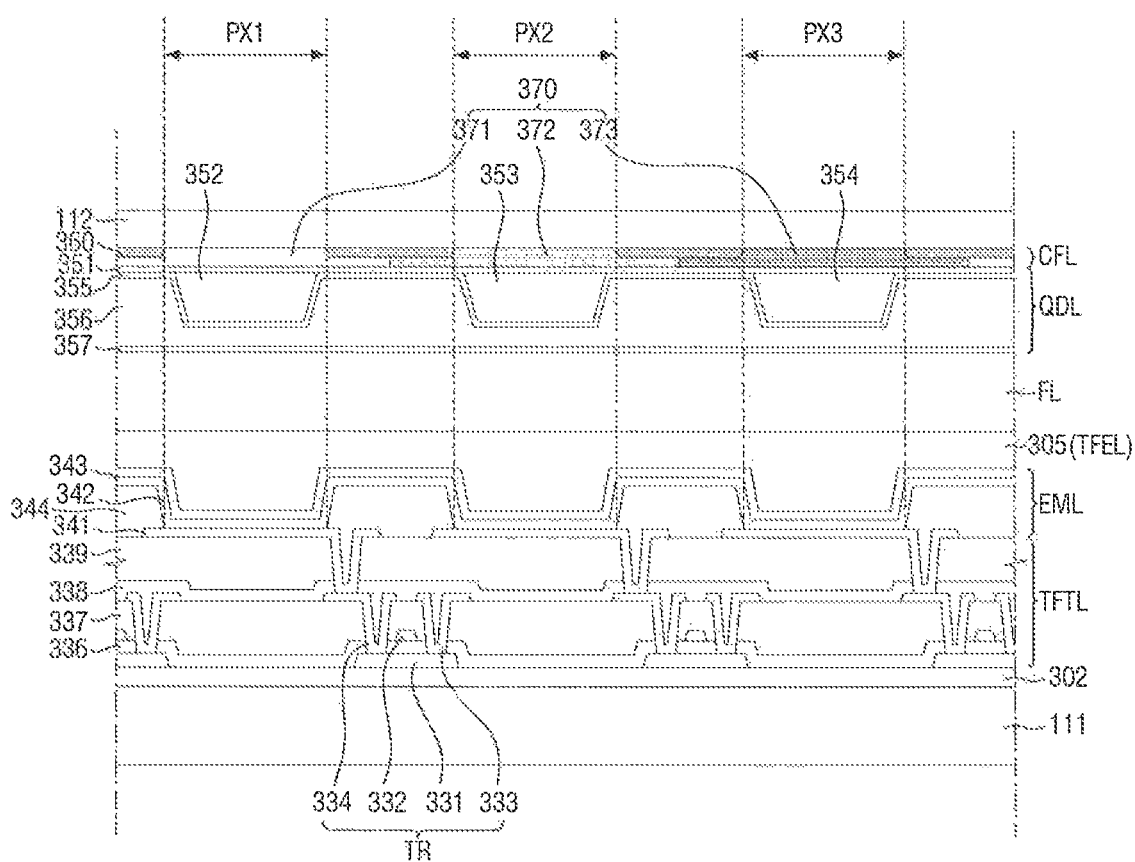
FIG. 17 is a cross-sectional view illustrating a display area of the display panel of FIG. 2.

FIG. 17 is a cross-sectional view illustrating a display area of the display panel of FIG. 2.

Referring to FIG. 17, the display panel 300 may include a first substrate 111, a second substrate 112, a thin-film transistor (TFT) layer TFTL, a light-emitting element layer EML, a thin-film encapsulation layer (TFEL) 305, a filler member FL, a wavelength conversion layer QDL, and a color filter layer CFL.

A buffer film 302 may be formed on the first substrate 111. For example, the buffer film 302 may be formed on a surface of the first substrate 111 that faces the second substrate 112. The buffer film 302 may be formed on the first substrate 111 to protect TFTs TR and light-emitting elements against moisture that may penetrate the first substrate 111, which may be susceptible to moisture. The buffer film 302 may include a plurality of inorganic films that are alternately stacked. For example, the buffer film 302 may be formed as a multilayer film in which a silicon oxide (SiOx) film, a silicon nitride (SiNx) film, and/or a silicon oxynitride (SiON) film are alternately stacked. The buffer film 302 may not be provided.

The TFT layer TFTL is formed on the buffer film 302. The TFT layer TFTL includes TFTs TR, a gate insulating film 336, an interlayer insulating film 337, a passivation film 338, and a planarization film 339.

The TFTs TR are formed on the buffer film 302. Each of the TFTs TR includes an active layer 331, a gate electrode 332, a source electrode 333, and a drain electrode 334. FIG. 17 illustrates the TFTs TR as having a top gate structure in which the gate electrode 332 is disposed above the active layer 331, but the present invention is not limited thereto. For example, the TFTs TR may have a bottom gate structure in which the gate electrode 332 is disposed below the active layer 331 or a double gate structure in which the gate electrode 332 is disposed both above and below the active layer 331.

The active layer 331 is formed on the buffer film 302. The active layer 331 may be formed of, for example, a silicon-based semiconductor material or an oxide-based semiconductor material. A light-shielding layer for blocking external light incident on the active layer 331 may be formed between the buffer layer and the active layer 331.

A gate insulating film 336 may be formed on the active layer 331. The gate insulating film 316 may be formed as an inorganic film such as, for example, a silicon oxide film, a silicon nitride film, or a multilayer film thereof.

The gate electrode 332 and a gate line may be formed on the gate insulating film 316. The gate electrode 332 and the gate line may be formed as single- or multilayer films using, for example, molybdenum (Mo), Al, chromium (Cr), gold (Au), titanium (Ti), Ni, Nd, Cu, or an alloy thereof.

The interlayer insulating film 337 may be formed on the gate electrode 332 and the gate line. The interlayer insulating film 337 may be formed as an inorganic film such as, for example, a silicon oxide film, a silicon nitride film, or a multilayer film thereof.

The source electrode 333, the drain electrode 334, and a data line may be formed on the interlayer insulating film 337. The source electrode 333 and the drain electrode 334 may be connected to the active layer 331 through contact holes penetrating the gate insulating film 336 and the interlayer insulating film 337. The source electrode 333, the drain electrode 334, and the data line may be formed as single- or multilayer films using, for example, Mo, Al, Cr, Au, Ti, Ni, Nd, Cu, or an alloy thereof.

The passivation film 338 may be formed on the source electrode 33, the drain electrode 334, and the data line to insulate the TFTs TR. The passivation film 338 may be formed as an inorganic film such as, for example, a silicon oxide film, a silicon nitride film, or a multilayer film thereof.

The planarization film 339 may be formed on the passivation film 338 to planarize height differences formed by the TFTs TR. The planarization film 339 may be formed as an organic film using an acrylic resin, an epoxy resin, a phenolic resin, a polyamide resin, or a polyimide resin.

The light-emitting element layer EML is formed on the TFT layer TFTL. The light-emitting element layer EML includes light-emitting elements and a pixel defining film 344.

The light-emitting elements and the pixel defining film 344 are formed on the planarization film 339. The light-emitting elements may be OLEDs. In this case, each of the light-emitting elements may include an anode electrode 341, a light-emitting layer 342, and a cathode electrode 343.

The anode electrode 341 may be formed on the planarization film 339. The anode electrode 341 may be connected to the drain electrode 334 through a contact hole penetrating the passivation film 338 and the planarization film 339.

The pixel defining film 344 may be formed to cover the edges of the anode electrode 341 to provide a corresponding pixel. For example, the pixel defining film 344 may provide a plurality of first, second, and third subpixels PX1, PX2, and PX2. Each of the first, second, and third subpixels PX1, PX2, and PX3 may be a region in which the anode electrode 341, the light-emitting layer 342, and the cathode electrode 343 are sequentially stacked and holes from the anode electrode 341 and electrons from the cathode electrode 343 are combined in the light-emitting layer 342 to emit light.

The light-emitting layer 342 may be formed on the anode electrode 341 and the pixel defining film 344. The light-emitting layer 342 may be an organic light-emitting layer. For example, the light-emitting layer 342 may emit blue light or short-wavelength light such as ultraviolet (UV) light. The peak wavelength range of the blue light may be about 450 nm to about 490 nm, and the peak wavelength range of the UV light may be about 450 nm or shorter. In this case, the light-emitting layer 342 may be a common layer formed in common for all the first, second, and third subpixels PX1, PX2, and PX3, and the display panel 300 may include the light wavelength conversion layer QDL, which converts the blue light or the short-wavelength light (such as UV light) emitted by the light-emitting layer 342 into red light, green light, and blue light, and the color filter layer CFL, which transmits red light, green light, and blue light therethrough.

The light-emitting layer 342 may include a hole transport layer, an emission layer, and an electron transport layer. The light-emitting layer 342 may have a stacked structure with two or more stacks, in which case, a charge generating layer may be formed between the stacks.

The cathode electrode 343 may be formed on the light-emitting layer 342. The cathode electrode 343 may be formed to cover the light-emitting layer 342. The cathode electrode 343 may be a common layer formed commonly for all pixels.

The light-emitting element layer EML may be formed as a top emission-type light-emitting element layer that emits light in a direction toward the second substrate 112, e.g., in an upper direction. In this case, the anode electrode 341 may be formed of a metal material with high reflectance such as a stack of Al and Ti (e.g., Ti/Al/Ti), a stack of Al and ITO (e.g., ITO/Al/ITO), a silver (Ag)-palladium (Pd)-copper (Cu) (APC) alloy, and/or a stack of an APC alloy and ITO (e.g., ITO/APC/ITO). The cathode electrode 343 may be formed of a transparent conductive oxide (TCO) material such as ITO and/or IZO that can transmit light therethrough or a semi-transmissive conductive material such as magnesium (Mg), Ag, or an alloy thereof. In a case where the cathode electrode 343 is formed of a semi-transmissive conductive material, the emission efficiency of the light-emitting element layer 304 may be increased due to a micro-cavity effect.

The TFEL 305 is formed on the light-emitting element layer EML. The TFEL 305 may prevent oxygen or moisture from infiltrating into the light-emitting layer 342 and the cathode electrode 343. The TFEL 305 may include at least one inorganic film. The inorganic film may be formed of silicon nitride, aluminum nitride, zirconium nitride, titanium nitride, hafnium nitride, tantalum nitride, silicon oxide, aluminum oxide, and/or titanium oxide. The TFEL 305 may further include at least one organic film. For example, the organic film may be formed to have a sufficient thickness to prevent foreign particles from entering the light-emitting layer 342 and the cathode electrode 343 through the TFEL 305. The organic film may include one of epoxy, acrylate, and urethane acrylate.

The color filter layer CFL is disposed on the second substrate 112. For example, the color filter layer CFL may be disposed on a surface of the second substrate 112 that faces the first substrate 111. The color filter layer CFL may include a black matrix 360 and color filters 370.

The black matrix 360 may be formed on the second substrate 112. The black matrix 360 may be disposed to overlap with the pixel defining film 344, but not with the first, second, and third subpixels PX1, PX2, and PX3. The black matrix 360 may include a black pigment or an opaque metal material capable of blocking the transmission of light without transmitting light therethrough.

The color filters 370 may be disposed to overlap with the first, second, and third subpixels PX1, PX2, and PX3. A first color filter 371 may be disposed to overlap with the first subpixel PX1, a second color filter 372 may be disposed to overlap with the second subpixel PX2, and a third color filter 373 may be disposed to overlap with the third subpixel PX3. In this case, the first color filter 371 may be a first-color light transmitting filter transmitting light of a first color, the second color filter 372 may be a second-color light transmitting filter transmitting light of a second color, and the third color filter 373 may be a third-color light transmitting filter transmitting light of a third color. For example, the first, second, and third colors may be red, green, and blue, respectively, but the present invention is not limited thereto. The peak wavelength range of red light passing through the first color filter 371 may be about 620 nm to about 750 nm, the peak wavelength range of green light passing through the second color filter 372 may be about 500 nm to about 570 nm, and the peak wavelength range of blue light passing through the third color filter 373 may be about 450 nm to about 490 nm.

The boundaries between the color filters 370 may overlap with the black matrix 360. Accordingly, the black matrix 370 can prevent light emitted from the light-emitting layer 342 of one subpixel from entering the color filter 370 of another subpixel to cause color mixing.

An overcoat layer may be formed on the color filters 370 to planarize height differences caused by the color filters 370 and the black matrix 360. The overcoat layer may not be provided.

The wavelength conversion layer QDL is disposed on the color filter layer CFL. The wavelength conversion layer QDL may include a first capping layer 351, a first wavelength conversion layer 352, a second wavelength conversion layer 353, a third wavelength conversion layer 354, a second capping layer 355, an interlayer organic film 356, and a third capping layer 357.

The first capping layer 351 may be disposed on the color filter layer CFL. The first capping layer 351 may prevent moisture or oxygen from infiltrating into the first, second, and third wavelength conversion layers 352, 353, and 354 through the color filter layer CFL. The first capping layer 351 may be formed as an inorganic film using, for example, silicon nitride, aluminum nitride, zirconium nitride, titanium nitride, hafnium nitride, tantalum nitride, silicon oxide, aluminum oxide, and/or titanium oxide.

The first, second, and third wavelength conversion layers 352, 353, and 354 may be disposed on the first capping layer 351.

The first wavelength conversion layer 352 may be disposed to overlap with the first subpixel PX1. The first wavelength conversion layer 352 may convert the blue light or the short-wavelength light (such as UV light) emitted from the light-emitting layer 342 of the first subpixel PX1 into light of the first color. For example, the first wavelength conversion layer 352 may include a first base resin, a first wavelength shifter, and a first scatterer.

The first base resin may be formed of a material having high light transmittance and excellent dispersion characteristics for the first wavelength shifter and the first scatterer. For example, the first base resin may include an organic material such as an epoxy resin, an acrylic resin, a cardo resin, or an imide resin.

The first wavelength shifter may convert or shift the wavelength of incident light. The first wavelength shifter may be, for example, quantum dots, quantum rods, or a phosphor. In a case where the first wavelength shifter is quantum dots, which are a semiconductor nanocrystal material, the first wavelength shifter may have a predetermined band gap depending on the composition and the size thereof. Thus, the first wavelength shifter may absorb incident light and may then emit light of a predetermined wavelength. The first wavelength shifter may have a core-shell structure consisting of a core including nanocrystals and a shell surrounding the core. In this case, examples of the nanocrystals include group IV nanocrystals, group II-VI compound nanocrystals, group III-V compound nanocrystals, group IV-VI nanocrystals, or a combination thereof. The shell may serve as a passivation layer for preventing chemical deformation of the core to maintain semiconductor characteristics and/or as a charging layer for imparting the quantum dots electrophoretic characteristics. The shell may be a single- or multilayer film. Examples of the shell include an oxide of a metal or a non-metal, a semiconductor compound, and a combination thereof.

The first scatterer may have a different refractive index from the first base resin and may form an optical interface with the first base resin. For example, the first scatterer may be light-scattering particles. For example, the first scatterer may be metal oxide particles such as particles of titanium oxide ($TiO_2$), silicon oxide ($SiO_2$), zirconium oxide ($ZrO_2$), aluminum oxide ($Al_2O_3$), zinc oxide (ZnO), or tin oxide ($SnO_2$). In another example, the first scatterer may be organic particles such as particles of an acrylic resin or a urethane resin.

The first scatterer may scatterer incident light in random directions without substantially changing the wavelength of light passing through the first wavelength conversion layer 352. In this manner, the path of light transmitting the first wavelength conversion layer 352 can be lengthened, and the color conversion efficiency of the first wavelength shifter can be increased.

The first wavelength conversion layer 352 may overlap with the first color filter 371. In addition, some of the blue light or the short-wavelength light (such as UV light) provided by the first subpixel PX1 may pass through the first wavelength conversion layer 352 without being converted into light of the first color by the first wavelength shifter. However, the blue light or the short-wavelength light (such as UV light) incident upon the first color filter 371 without being converted by the first wavelength conversion layer 352 cannot pass through the first color filter 371. The light of the first color obtained by and converted by the first wavelength conversion layer 352 can pass through the first color filter 371 and can be emitted in the direction toward the second substrate 112.

The second wavelength conversion layer 353 may be disposed to overlap with the second subpixel PX2. The second wavelength conversion layer 353 may convert the blue light or the short-wavelength light (such as UV light) emitted from the light-emitting layer 342 of the second subpixel PX2 into light of the second color. For example, the second wavelength conversion layer 353 may include a second base resin, a second wavelength shifter, and a second scatterer. The second base resin, the second wavelength shifter, and the second scatterer of the second wavelength conversion layer 353 are substantially the same as the first base resin, the first wavelength shifter, and the first scatterer, respectively, of the first wavelength conversion layer 352, and thus, detailed descriptions thereof may be omitted. However, in a case where the first and second wavelength shifters are both quantum dots, the diameter of the second wavelength shifter may be smaller than the diameter of the first wavelength shifter.

The second wavelength conversion layer 353 may overlap with the second color filter 372. In addition, some of the blue light or the short-wavelength light (such as UV light) provided by the second subpixel PX2 may pass through the second wavelength conversion layer 353 without being converted into light of the second color by the second wavelength shifter. However, the blue light or the short-wavelength light (such as UV light) incident upon the second color filter 372 without being converted by the second wavelength conversion layer 353 cannot pass through the second color filter 372. The light of the second color obtained by and converted by the second wavelength conversion layer 353 can pass through the second color filter 372 and can be emitted in the direction toward the second substrate 112.

The third wavelength conversion layer 354 may be disposed to overlap with the third subpixel PX3. The third wavelength conversion layer 354 may convert the blue light or the short-wavelength light (such as UV light) emitted from the light-emitting layer 342 of the third subpixel PX3 into light of the third color. For example, the third wavelength conversion layer 354 may include a third base resin, a third wavelength shifter, and a third scatterer. The third base resin, the third wavelength shifter, and the third scatterer of the third wavelength conversion layer 354 are substantially the same as the first base resin, the first wavelength shifter, and the first scatterer, respectively, of the first wavelength conversion layer 352, and thus, detailed descriptions thereof may be omitted.

The third wavelength conversion layer 354 may overlap with the third color filter 373. In addition, some of the blue light or the short-wavelength light (such as UV light) provided by the third subpixel PX3 may pass through the third wavelength conversion layer 354 as it is (e.g., without being converted by the third wavelength conversion layer 354) and may then be emitted in the direction toward the second substrate 112 through the third color filter 373.

The second capping layer 355 may be disposed on the first, second, and third wavelength conversion layers 352, 353, and 354 and parts of the first capping layer 351 that are exposed without being covered (or, e.g., overlapped) by the first, second, and third wavelength conversion layers 352, 353, and 354. The second capping layer 355 may prevent moisture or oxygen from infiltrating into the first, second, and third wavelength conversion layers 352, 353, and 354. The second capping layer 355 may be formed as an inorganic film using, for example, silicon nitride, aluminum nitride, zirconium nitride, titanium nitride, hafnium nitride, tantalum nitride, silicon oxide, aluminum oxide, and/or titanium oxide.

The interlayer organic film 356 may be disposed on the second capping layer 355. For example, the interlayer organic film 356 may be disposed on a lower surface of the second capping layer 355. The interlayer organic film 356 may be a planarization layer for planarizing height differences formed by the first, second, and third wavelength conversion layers 352, 353, and 354. The interlayer organic film 356 may be formed as an organic film using, for example, an acrylic resin, an epoxy resin, a phenolic resin, a polyamide resin, and/or a polyimide resin.

The third capping layer 357 may be disposed on the interlayer organic film 356. For example, the third capping layer 357 may be disposed on a lower surface of the interlayer organic film 356. The third capping layer 357 may be formed as an inorganic film using, for example, silicon nitride, aluminum nitride, zirconium nitride, titanium nitride, hafnium nitride, tantalum nitride, silicon oxide, aluminum oxide, and/or titanium oxide.

The filler member FL may be disposed between the TFEL 305, which is disposed on the first substrate 111, and the third capping layer 357, which is disposed on the second substrate 112. The filler member FL may be formed of a material having a buffer function. For example, the filler member FL may be formed as an organic film using an acrylic resin, an epoxy resin, a phenolic resin, a polyamide resin, and/or a polyimide resin.

In a non-display area of the display panel 300, an adhesive layer for bonding the first and second substrates 111 and 112 may be disposed, and in a plan view, the filler member FL may be surrounded by the adhesive layer.

According to the present embodiment, with reference to FIG. 17, the first, second, and third subpixels PX1, PX2, and PX3 emit blue light or short-wavelength light such as UV light. The light from the first subpixel PX1 may be converted into light of the first color through the first wavelength conversion layer 352 and may then be output through the first color filter 371. The light from the second subpixel PX2 may be converted into light of the second color through the second wavelength conversion layer 353 and may then be output through the second color filter 372, and the light from the third subpixel PX3 may be output through the third wavelength conversion layer 354 and the third color filter 373. Accordingly, white light can be output.

In addition, according to the present embodiment, with reference to FIG. 17, since the first, second, and third subpixels PX1, PX2, and PX3 are driven in a top emission manner and emit light in the direction toward the second substrate 112, a first heat dissipation film including an opaque material such as graphite or A1 may be disposed on the first substrate 111.

Exemplary embodiments of the present invention may provide a display device for outputting sound and providing a haptic feedback using an electronic permanent magnet and a vibrator that are within the display device.

Exemplary embodiments of the present invention may also provide a driving method of a display device for outputting sound and providing a haptic feedback using an electronic permanent magnet and a vibrator that are within the display device.

While the present invention has been particularly shown and described with reference to exemplary embodiments thereof, it will be apparent to those of ordinary skill in the art that various changes in form and detail may be made thereto without departing from the spirit and scope of the present invention as defined by the following claims.

What is claimed is:

1. A display device comprising:
a display panel;
a panel bottom member disposed on the display panel;
a middle frame disposed on the panel bottom member;
an electronic permanent magnet attached to the panel bottom member and that switches between an activation state to generate a magnetic force and an inactivation state; and
a vibrator attached to the middle frame and that vibrates,
wherein the electronic permanent magnet and the vibrator overlap each other in a thickness direction of the display device.

2. The display device of claim 1. wherein when the electronic permanent magnet is in the activation state, the vibrator is configured to contact the electronic permanent magnet due to the magnetic force generated by the electronic permanent magnet.

3. The display device of claim 2, wherein when the electronic permanent magnet is in the inactivation state, the vibrator and the electronic permanent magnet are separated from each other the thickness direction.

4. The display device of claim 3, further comprising:
a sound driver electrically connected to the vibrator,
wherein when the electronic permanent magnet is in the activation state, the sound driver generates sound by driving. the vibrator to vibrate the display panel and the panel bottom member.

5. The display device of claim 4, wherein when the electronic permanent magnet is in the inactivation state, the sound driver provides a haptic feedback by driving the vibrator to vibrate the middle lame.

6. The display device of claim 5, wherein when the electronic permanent magnet is in the inactivation state of the electronic permanent magnet, a distance between the vibrator and the electronic permanent magnet is greater than a vibration displacement of the vibrator.

7. The display device of claim 1, wherein
the electronic permanent magnet includes first and second magnets which are separated from each other,
the first magnet includes a magnetically semi-hard material, and
the second magnet includes a magnetically hard material.

8. The display device of claim 7, wherein
the electronic permanent magnet further includes a top cover and a bottom cover, wherein the top cover is in contact with upper surfaces of the first and second magnets, wherein the bottom cover is in contact with lower surfaces of the first and second magnets, and
the top cover is attached to the panel bottom member.

9. The display device of claim 7, wherein
the electronic permanent magnet further includes a coil which is wound around the first magnet, and
the first magnet has a first polarity when a current flows in the coil in a first direction and has a second polarity, which is opposite to the first polarity, when a current flows in the coil in a second direction, which is opposite to the first direction.

10. The display device of claim 1, wherein the vibrator is a linear resonant actuator.

11. The display device of claim 1, wherein the vibrator is an exciter.

12. The display device of claim 1, further comprising:
a first circuit board connected to the electronic permanent magnet; and
a second circuit board connected to the vibrator.

13. The display device of claim 12, further comprising:
a display circuit board attached to the display panel,
wherein the first and second circuit boards are connected to the display circuit board.

14. The display device of claim 13, wherein the display circuit board includes a magnet driver that provides the electronic permanent magnet with a first current flowing in a first direction and a second current flowing in a second direction that is opposite to the first direction.

15. The display device of claim 14, wherein the display circuit board further includes a sound driver that outputs first and second driving voltages to the vibrator.

16. The display device of claim 15, further comprising:
a main circuit board disposed on the middle frame and including a main processor,
wherein the main processor outputs sound data or haptic data to the sound driver.

17. A driving method of a display device, comprising:
outputting sound by vibrating an electronic permanent magnet and a vibrator when in an activation state where an electronic permanent magnet generates a magnetic force and
providing a haptic feedback by vibrating the vibrator when in an inactivation state where the electronic permanent magnet does not generate the magnetic force, wherein, when the haptic feedback is being provide& the electronic permanent magnet is stationary while the vibrator is vibrating.

18. The driving method of claim 17, wherein the outputting the sound comprises activating the electronic permanent magnet by applying a current flowing in a first direction to the electronic permanent magnet such that the electronic permanent magnet and the vibrator contact each other.

19. The driving method of claim 18, wherein the outputting the sound further comprises vibrating a display panel of the display device with vibrations generated from the vibrator while the electronic permanent magnet and the vibrator are in contact with each other.

20. The driving method of claim 19, wherein the providing the haptic feedback comprises inactivating the electronic permanent magnet by applying a current flowing in a second direction, which is opposite to the first direction, to the electronic permanent magnet such that the electronic permanent magnet and the vibrator are separated from each other.

* * * * *